(12) United States Patent
Fohrenkamm et al.

(10) Patent No.: US 12,474,639 B2
(45) Date of Patent: Nov. 18, 2025

(54) FLEXOGRAPHIC PRINTING MASK WITH LASER THERMAL IMAGING FILM

(71) Applicant: MIRACLON CORPORATION, Oakdale, MN (US)

(72) Inventors: Elsie Anderson Fohrenkamm, St. Paul, MN (US); Muluken N Taye, St. Paul, MN (US); Huiqun Wang, St. Paul, MN (US); Mohammad Zaki Ali, Mendota Heights, MN (US)

(73) Assignee: MIRACLON CORPORATION, Oakdale, MN (US)

( * ) Notice: Subject to any disclaimer, the term of this patent is extended or adjusted under 35 U.S.C. 154(b) by 763 days.

(21) Appl. No.: 17/731,055

(22) Filed: Apr. 27, 2022

(65) Prior Publication Data
US 2023/0350298 A1    Nov. 2, 2023

(51) Int. Cl.
| | | |
|---|---|---|
| *G03F 7/11* | (2006.01) | |
| *B41M 1/04* | (2006.01) | |
| *G03F 1/32* | (2012.01) | |
| *G03F 7/032* | (2006.01) | |
| *G03F 7/20* | (2006.01) | |
| *G03F 7/32* | (2006.01) | |

(52) U.S. Cl.
CPC .................. *G03F 7/11* (2013.01); *B41M 1/04* (2013.01); *G03F 7/0325* (2013.01); *G03F 7/202* (2013.01); *G03F 7/325* (2013.01)

(58) Field of Classification Search
CPC ....................................................... B41M 1/04
See application file for complete search history.

(56) References Cited

U.S. PATENT DOCUMENTS

| | | |
|---|---|---|
| 3,458,311 A | 7/1969 | Alles |
| 3,794,494 A | 2/1974 | Inoue |
| (Continued) | | |

FOREIGN PATENT DOCUMENTS

| | | |
|---|---|---|
| EP | 1182033 | 11/2006 |

OTHER PUBLICATIONS

International Search Report and Written Opinion of the International Searching Authority dated Sep. 19, 2023 as received In Application No. PCT/US2023/014991.

*Primary Examiner* — Chanceity N Robinson
(74) *Attorney, Agent, or Firm* — Maschoff Brennan

(57) ABSTRACT

A mask element for flexographic printing is provided. The mask element can be used for preparing a mask that has a mask image. The mask element can include: a transparent polymeric carrier sheet; a barrier layer on the transparent polymeric carrier sheet, wherein the barrier layer comprises non-crosslinked nitrocellulose; and an imaging layer on the barrier layer, wherein the imaging layer includes a non-silver halide thermally-ablatable material comprising non-crosslinked nitrocellulose, carbon black, and an infrared (IR) dye. In some aspects, the mask element further includes a transparent overcoat layer on the imaging layer. The mask can include: imaged regions in the imaging layer, wherein the imaged regions have optical apertures that are substantially devoid of the carbon black and non-crosslinked nitrocellulose thereof; and non-imaged regions in the imaging layer, wherein the non-imaged regions have the non-crosslinked nitrocellulose, carbon black, and infrared dye.

7 Claims, 5 Drawing Sheets

(56) References Cited

U.S. PATENT DOCUMENTS

| | | | |
|---|---|---|---|
| 4,045,231 A | 8/1977 | Toda | |
| 4,177,074 A | 12/1979 | Proskow | |
| 4,323,636 A | 4/1982 | Chen | |
| 4,323,637 A | 4/1982 | Chen et al. | |
| 4,361,640 A | 11/1982 | Pine | |
| 4,427,749 A | 1/1984 | Graetzel et al. | |
| 4,430,417 A | 2/1984 | Heinz | |
| 4,431,723 A | 2/1984 | Proskow | |
| 4,442,302 A | 4/1984 | Pohl | |
| 4,460,675 A | 7/1984 | Gruetzmacher et al. | |
| 4,517,279 A | 5/1985 | Worns | |
| 4,588,674 A | 5/1986 | Stewart et al. | |
| 4,726,877 A | 2/1988 | Fryd | |
| 4,753,865 A | 6/1988 | Fryd | |
| 4,894,315 A | 1/1990 | Feinberg et al. | |
| 4,956,252 A | 9/1990 | Fryd | |
| 5,171,650 A | 12/1992 | Ellis et al. | |
| 5,208,135 A | 5/1993 | Patel et al. | |
| 5,496,685 A | 3/1996 | Farber et al. | |
| 5,496,903 A | 3/1996 | Watanate et al. | |
| 6,014,929 A * | 1/2000 | Teng | B41C 1/1016 101/450.1 |
| 6,153,356 A | 11/2000 | Urano et al. | |
| 6,259,465 B1 | 7/2001 | Tutt et al. | |
| 6,264,920 B1 | 7/2001 | Achilefu et al. | |
| 6,309,792 B1 | 10/2001 | Hauck et al. | |
| 6,569,603 B2 | 5/2003 | Furukawa | |
| 6,787,281 B2 | 9/2004 | Tao et al. | |
| 7,799,504 B2 * | 9/2010 | Zwadlo | G03F 1/68 430/273.1 |
| 7,802,598 B2 | 9/2010 | Zwadlo et al. | |
| 8,142,987 B2 | 3/2012 | Ali et al. | |
| 8,198,012 B2 | 6/2012 | Zwadlo et al. | |
| 8,399,177 B2 | 3/2013 | Stolt et al. | |
| 8,945,813 B2 | 2/2015 | Kidnie | |
| 9,250,527 B2 | 2/2016 | Kidnie | |
| 10,768,520 B2 | 9/2020 | Kidnie | |
| 2001/0053498 A1 * | 12/2001 | Fujimoto | G03F 7/202 430/281.1 |
| 2005/0227182 A1 | 10/2005 | Ali et al. | |
| 2009/0305162 A1 | 12/2009 | Melamed et al. | |
| 2012/0219773 A1 | 8/2012 | Zwadlo et al. | |
| 2012/0237871 A1 * | 9/2012 | Zwadlo | G03F 7/325 430/306 |
| 2015/0093707 A1 * | 4/2015 | Kidnie | G03F 7/2002 430/324 |
| 2018/0170088 A1 | 6/2018 | Beyer et al. | |
| 2019/0258154 A1 | 8/2019 | Kidnie | |
| 2022/0019145 A1 * | 1/2022 | Karim | G03F 7/0755 |

* cited by examiner

FLEXOGRAPHIC PRINTING MASK WITH LASER THERMAL IMAGING FILM

BACKGROUND

Field

The present disclosure relates to a thermal imaging film for a flexographic printing mask, and methods of making and using the same. More particularly, the present disclosure relates to a thermal imaging film before or after having a mask element formed therein.

Description of Related Art

Previously, photosensitive materials have been combined with masks that can be used for forming relief-images in flexographic printing plate precursors. However, materials used for the mask may have optical properties that can alter the formation of the relief image from the photosensitive relief-forming layer, which may not be optimal. Often, the mask can have an optical property that is less efficient and thereby takes a longer time in the processing of the relief-forming layer. The longer the processing time less economical a mask element is for the application for forming a relief image. Therefore, optimization of optical properties of the mask can improve the curing of the irradiated layers of the relief-forming layer of the flexographic printing plate.

Photosensitive relief-forming materials having a relief-forming material or photosensitive layer are known in the art. Important advances in the art and useful materials for making flexographic relief images are described in U.S. Pat. No. 8,142,987 (Ali et al., hereinafter cited as U.S. '987). U.S. '987 describes suitable mask element precursors, photosensitive materials for relief-forming layers, and processes and apparatus for forming a mask element from a mask precursor and eventual relief image from a photosensitive relief-forming precursor material.

Typically, a mask can be placed in intimate contact with a photosensitive relief-forming precursor material using a laminator device or vacuum drawdown, or both, and subjected to overall exposure with actinic radiation (for example, UV radiation) to cure the photosensitive composition in the relief-forming precursor material in the unmasked areas, thus forming a negative image of the mask in the photosensitive relief-forming precursor. The mask can then be removed and the uncured regions on the relief-forming material can be removed using a development process. After drying and post UV curing, the resulting imaged relief-forming precursor has a relief image that can be used for flexographic or letterpress printing operations.

Advances in mask element precursors are described in U.S. Pat. No. 7,799,504 (Zwadlo et al.). Other useful mask element precursors and processes for their use are described in U.S. Pat. No. 8,198,012 (Zwadlo et al.), U.S. Pat. No. 8,945,813 (Kidnie), and U.S. Pat. No. 9,250,527 (Kidnie). Advances in photosensitive materials are described in U.S. No. 2019/0258154 (Kidnie).

Previously, laser imaging materials included carbon black in an overlayer, such as described in U.S. Pat. No. 4,588,674. Here, the carbon black has been used in the overlying layer to give the carbon black to binder ratio is preferably selected so as to give hard abrasion-resistant coatings having an optical density greater than 2.0.

The claimed subject matter is not limited to embodiments that solve any disadvantages or that operate only in environments such as those described above. This background is only provided to illustrate examples of where the present disclosure may be utilized.

SUMMARY

In some embodiments, a mask element for flexographic printing can include: a substrate; a polymeric layer on the substrate; a non-silver halide thermally-ablatable imaging layer on the polymeric layer and having carbon black and at least one other infrared absorbing material in a thermally-abatable polymeric binder. The substrate can be a transparent polymeric carrier sheet. The polymeric layer can be a barrier layer having non-crosslinked nitrocellulose. The non-silver halide thermally-ablatable imaging layer can be an imaging layer having non-crosslinked nitrocellulose, carbon black, and an infrared (IR) dye (e.g., selective for IR light absorption) (e.g., no silver halide present).

In some embodiments, a mask element for flexographic printing is provided. The mask element can be a mask precursor that is used for preparing a mask that has a mask image. The mask element can include: a transparent polymeric carrier sheet; a barrier layer on the transparent polymeric carrier sheet, wherein the barrier layer comprises non-crosslinked nitrocellulose; and an imaging layer on the barrier layer, wherein the imaging layer includes a thermally-ablatable material comprising non-crosslinked nitrocellulose, carbon black, and an IR dye. In some aspects, the mask element further includes a transparent overcoat layer on the imaging layer.

In some embodiments, the polymeric barrier layer can be devoid of an IR dye. That is, the barrier layer can be devoid of an IR dye that is selective for absorbing UV light, which can absorb IR light over visible light or UV light.

In some embodiments, the imaging layer can be devoid of an ultraviolet (UV) dye. That is, the imaging layer can be devoid of a UV dye that is selective for absorbing UV light, which can absorb UV light over visible light or IR light.

In some embodiments, the imaging layer is devoid of particles, such as thermally-ablatable particles or non-thermally-ablatable particles (not thermally ablatable).

Some embodiments of the mask element can have different configurations. In some aspects, the barrier layer is devoid of UV dyes. In some aspects, the barrier layer optionally contains 0-10% of an IR dye. In some aspects, there can be at least one plasticizer in the barrier layer. The plasticizer in the barrier layer can be present in an amount from about 10% to about 40%. In some aspects, the carbon black can be present in an amount from about 30% to about 70%. The carbon black can be pre-dispersed in the nitrocellulose. In some aspects, the infrared dye in the imaging layer can be present in an amount from about 0.1% to about 15%. Also, there can be at least one plasticizer in the imaging layer. The plasticizer in the imaging layer can be present in an amount from about 10% to about 40%. In some aspects, the plasticizer in the barrier layer can be selected from the group consisting of ATBC, Alchemix, PEG-1000, and combinations thereof. In some aspects, the plasticizer in the imaging layer is selected from the group consisting of ATBC, PEG-1000, and combinations thereof. In some aspects, the plasticizer can be a non-phthalate plasticizer.

In some embodiments, a mask can include the mask element of any embodiment with at least one mask image formed therein. The mask can include imaged regions in the imaging layer, wherein the imaged regions have optical apertures that are substantially devoid of the carbon black and the non-crosslinked nitrocellulose thereof. The mask can include non-imaged regions in the imaging layer, wherein the non-imaged regions have the non-crosslinked nitrocellulose, carbon black, and infrared dye, and optionally plasticizer. The mask can have an optical density of greater than 3.0 in the non-imaged region, and less than about 0.20 in the fully ablated imaged region.

In some embodiments, a method of making the mask element can include: forming the transparent polymeric carrier sheet; forming the barrier layer on the transparent polymeric carrier sheet; and forming the imaging layer on the barrier layer. The method can include forming a transparent overcoat layer on the imaging layer. The method can include forming the barrier layer to include at least one plasticizer. The method can include forming the imaging layer to include at least one plasticizer.

In some embodiments, a method of making a mask can include: providing the mask element of one of the embodiments without any imaged regions in the imaging layer; and imaging the mask element with infrared light to form the imaged regions in the imaging layer. In some aspects, the imaging ablates the carbon black, non-crosslinked nitrocellulose and other materials in the imaging layer to form the optical apertures that present the mask image. In some embodiments, the method of making a mask for flexographic printing can include exposing the thermally-ablatable imaging layer to infrared radiation to selectively ablate regions in the and thermally-ablatable imaging layer. The thermally-ablatable imaging layer has a mask image formed therein, wherein the mask image includes regions of the thermally-ablatable imaging layer and regions omitting the thermally-ablatable imaging layer that have been thermally ablated.

In some embodiments, the imaging layer has a mask image formed therein. The mask image includes regions of the thermally-ablatable imaging layer and regions omitting the thermally-ablatable imaging layer that have been thermally ablated.

In some embodiments, a relief-forming assembly can include a relief-forming precursor and a mask element for flexographic printing. The mask can include: a transparent carrier sheet substrate; a polymeric barrier layer on the substrate and optionally having a plasticizer and/or at least one first infrared absorbing material; a thermally-ablatable imaging layer on the polymeric barrier layer and having at least one second infrared absorbing material (e.g., not carbon black), carbon black in a thermally-ablatable ablatable polymeric binder (e.g., non-crosslinked nitrocellulose), and optionally plasticizer. The thermally-ablatable imaging layer has a mask image formed therein. The mask image includes regions of the thermally-ablatable imaging layer and regions that omit the thermally-ablatable imaging layer that have been thermally ablated.

In some embodiments, a method of making the relief-forming assembly can include: placing the mask element on a relief-forming surface of the relief-forming layer; and forming the complete optical contact between the mask element and the relief-forming surface. In some aspects, the methods can include at least one of: laminating the mask element to the relief-forming surface; or vacuum drawdown coupling the mask element to the relief-forming surface.

In some embodiments, a method of making a relief image in a relief-forming assembly can include: providing the relief-forming assembly of one of the embodiments; exposing a relief-forming layer of the relief-forming precursor to curing UV radiation through the mask element to form an imaged relief-forming layer with UV-exposed regions forming polymerized regions and non-exposed regions forming non-polymerized regions in the imaged relief-forming layer; removing the mask element from the imaged relief-forming layer; and developing the imaged relief-forming layer by removing the non-polymerized regions in the imaged relief-forming layer, thereby forming a relief image element having a relief image.

In some embodiments, a method of making a relief-forming assembly can include: providing a mask element in accordance with an embodiment; providing a relief-forming layer in accordance with an embodiment; placing a top surface of the mask element on a relief-forming surface of the relief-forming layer; and forming the complete optical contact between the mask element and the relief-forming surface. In some aspects, the method can include laminating the mask element to the relief-forming surface. In some aspects, the method can include vacuum drawdown coupling the mask element to the relief-forming surface.

In some embodiments, a method of making a relief image in a relief-forming assembly can include: providing a relief-forming assembly in accordance with an embodiment; exposing the relief-forming layer to curing UV radiation through the mask element to form an imaged relief-forming layer with UV-exposed regions forming polymerized regions and non-exposed regions forming non-polymerized regions in the imaged relief-forming layer; removing the mask element from the imaged relief-forming layer; and developing the imaged relief-forming layer by removing the non-polymerized regions in the imaged relief-forming layer, thereby forming a relief image element having a relief image (e.g., devoid of the non-polymerized regions). In some aspects, the method can include polymerizing the at least one photopolymerizable monomer at a relief surface of the relief image of the relief image element.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1A:
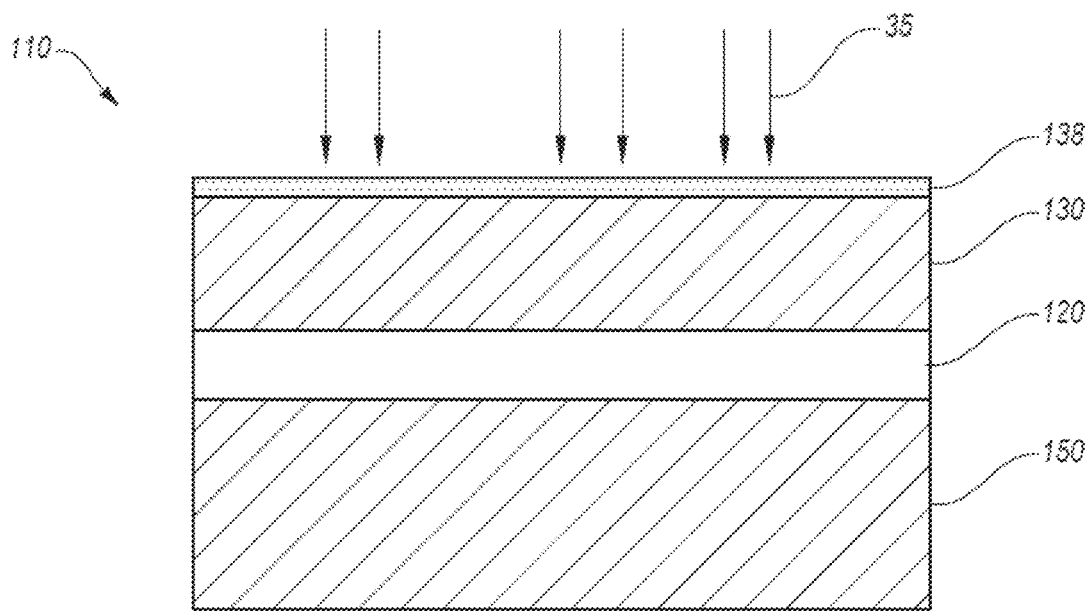
FIG. 1A is a cross-sectional schematic illustration of an embodiment of a mask precursor according to the present invention, and showing incident infrared radiation useful for making a mask element.

The elements and components in the figures can be arranged in accordance with at least one of the embodiments described herein, and which arrangement may be modified in accordance with the disclosure provided herein by one of ordinary skill in the art.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present technology provides an improved mask that can be used for UV exposure of a curable material in a relief-forming plate at reduced time and/or energy. Compared to other masks, the improved mask of the present technology has improved optical density parameters in the optical apertures of the mask, which results in shorter UV exposure times or less UV energy. As such, shorting UV exposure times or reducing UV energy can provide a significant economic advantage.

In some embodiments, a mask element for flexographic printing is provided. The mask element can be used for preparing a mask that has a mask image. The mask element can include: a transparent polymeric carrier sheet; a barrier layer on the transparent polymeric carrier sheet, wherein the barrier layer comprises non-crosslinked nitrocellulose and optionally a plasticizer; and an imaging layer on the barrier layer, wherein the imaging layer includes a thermally-ablatable material comprising non-crosslinked nitrocellulose, carbon black, and an infrared (IR) dye, and optionally a plasticizer. In some aspects, the mask element further includes a transparent overcoat layer on the imaging layer.

The Flexcel NX TIL-R thermal imaging film (U.S. Pat. No. 8,945,813) is used in the Kodak Flexcel NX system to make a flexographic printing plate. However, use of TIL-R requires a long main UV exposure time (e.g., 14 min with 30 mW UV light source, or 22 min with 20 mW light source) to make a high-resolution printing plate (e.g., retention of small highlight dots). TIL thermal imaging films can also be used (U.S. Pat. No. 10,768,520), which have UV exposure time of 12 min with 30 mW light source (e.g., 21 J/cm$^2$). A long main UV exposure time is detrimental to the productivity of the plate making process. A shorter main UV exposure time that is obtained with the improved mask described herein (e.g., 10 to 12 min with 30 mW UV light source) is thus highly desirable to improve plate making productivity.

The composition of the improved mask can provide for highly efficient ablation of the mask precursor compared to the ablation of the TIL-R mask precursor, as evidenced by a lower optical density (OD) for the improved masks of the present invention compared to the OD of a mask from a TIL-R precursor. For example, when both imaging films (TIL-R and presently improved mask) are laser ablated at the same laser power and drum speed settings of a laser imager operating at 830 nm, the improved mask has significantly shorter ablation time of 10 min compared to the ablation time of the TIL-R mask being 13 min.

The lower OD value of the improved mask allows more UV light to pass through the imaged areas (e.g., optical apertures) of the mask, thus making the photopolymerization of the relief-forming layer faster such that the UV exposure requirement time is shorter to achieve the same high resolution plate quality, such as holding of small dots on the plate. A mask produced form the improved thermal imaging film of the present invention requires a significantly reduced UV main exposure time to produce a high-resolution printing plate.

The OD is measured by a X-Rite Transmission Densitometer, as is defined by the following equation:

$$OD = -\log T_\lambda = -\log[(\% T\lambda)/100]$$

For example, OD of 0.10 corresponds to a light transmission of 79.3%, and an OD of 2.0 corresponds to a light transmission of 1%. Values can be interpolated between these points or extrapolated therefrom.

In some embodiments, the improved mask has an optical density of greater than or about 3.0 in the non-imaged regions, and less than or about 0.20 in the fully ablated imaged region. For example, the OD of the fully ablated imaged region in the mask can be less than or about 0.18, more preferably less than or about 0.15, more preferably less than or about 0.13, more preferably less than or about 0.12. Specific examples can include the OD ranging from about 0.11 to about 0.13 with the improved mask. The percent of UV light transmission can be from about 70%-80%, or about 74%-77% or about 75%. The OD for the non-imaged regions can be greater than 3.5. The higher optical OD of non-imaged area of the mask prevents image formation in the undesired area. For example, OD of 3.0 corresponds to a light transmission of only 0.1%.

The improved mask can also have shorter exposure, such as a shorter energy exposure, such as reduced joules per square centimeter. The prior masks can have UV exposure of 24 J/cm$^2$, whereas the improved mask can have UV exposure of from 17 J/cm$^2$ to 19 J/cm$^2$ and up to 21 J/cm$^2$.

The improved mask of the present invention also provides excellent stability of the imaging film at low to high humidity conditions. This is very desirable for shipping, storage, and loading and un-loading of the imaging film to the imaging devices to make the mask. Accordingly, the improved mask can have excellent resistance to edge curl in low and high humidity conditions.

Additionally, the improved mask can provide for a suitable flexographic printing plate, with the plate at 0.8% dots at 150 lpi being 100%.

Mask and Mask Precursor

The present technology provides an improved thermal imaging film, also referred to as a mask precursor or a mask element prior to being imaged and a mask subsequent to being imaged. That is, the thermal imaging film (TIF) includes an imaging layer that becomes imaged when exposed to infrared light. The imaging layer can be referred to as the non-silver halide thermally-ablatable imaging layer because it has no silver halide and it is thermally ablatable by infrared light. The imaging layer is provided in the mask precursor with a barrier layer, and optionally with a protective topcoat, with the imaging layer sandwiched therebetween. A transparent polymeric carrier sheet can be used as a substrate can retain the barrier layer thereon, so that the optional protective topcoat is on top of the imaging layer. The optional protective topcoat can be treated with small inorganic particulates or organic particles, in the range of 0.3 microns to 3 microns.

A mask can be configured for use with a relief-forming precursor with the photosensitive layer, where the top surface comes into contact with the photosensitive layer of the relief-forming precursor. The mask is obtained by imaging a mask precursor (e.g., mask element) with IR light. Thereby, a mask precursor can be prepared and processed with light (e.g., infrared, IR) to form the mask. The mask can then be combined with the relief-forming precursor (e.g., by lamination) and processed with light (e.g., UV), and then the mask and relief-forming precursor that is processed with light are separated from each other.

The mask precursor can be considered an imageable material due to having an imageable layer that forms the mask. In some embodiments, the mask precursor can include three or four layers or films as described below, in order: (a) a transparent polymeric carrier sheet (film); (b) a barrier layer; (c) a thermally-ablatable imaging layer; and (d) an optional particulate-treated protective topcoat. The thermally-ablatable imaging layer is ablatable by thermal imaging with light, such as IR light, but this thermally-ablatable imaging layer does not include a silver halide, and thereby is "a non-silver halide" imaging layer that is thermally ablatable. Accordingly, the imaging layer includes substances that are thermally ablatable, such as the non-crosslinked nitrocellulose having the carbon black, IR dye (e.g., specific for IR light, not broadband light absorption of a black body).

While the protective topcoat is ablatable, it may include particulates that may be ablatable or non-ablatable. While the protective topcoat can include non-ablatable particles, the protective topcoat is still ablatable. In part, the matrix of the protective topcoat can be non-crosslinked polymer so that it is ablatable.

The mask precursor that is used to form a mask element that is used eventually to form a relief image can be prepared and then processed into the mask as described herein. In some embodiments, the mask precursor 110 is illustrated in FIG. 1A, which has (a) transparent polymeric carrier sheet 150, on which is directly disposed (b) barrier layer 120, (c) an ablatable imaging layer 130 that is disposed directly on barrier layer 120 and positioned to receive the light 35 shown by the arrows, and (d) the optionally particulate-treated optional protective topcoat 138 is provided over the ablatable imaging layer 130.

Transparent Polymeric Carrier Sheet

The transparent polymeric carrier sheet can be any suitable transparent substrate or film. Useful transparent polymeric carrier sheets can be but are not limited to, transparent polymeric films and sheets composed of one or more polymers, such as polyesters including poly(ethylene terephthalate), poly(ethylene naphthalate), and fluorine polyester polymers; polyethylene-polypropylene copolymers; polybutadienes; polycarbonates; polyacrylates (polymers formed at least in part from one or more (meth)acrylate ethylenically unsaturated monomers); vinyl chloride polymers such as polyvinyl chloride and copolymers derived at least in part from vinyl chloride; hydrolyzed or non-hydrolyzed cellulose acetates; and other materials that would be readily apparent to one skilled in the art. The transparent polymeric carrier sheets can be composed of two or more polymeric materials as a blend or composite as long as the requisite transparency and protective properties are achieved. They can be formed as a single polymeric film or laminate of multiple polymeric films. Generally, the transparent polymeric carrier sheet has an average dry thickness of at least 25 μm and up to and including 250 μm, or typically of at least 75 μm and up to and including 175 μm.

For example, a transparent poly(ethylene terephthalate) sheet that is available from various commercial sources is suitable as a transparent polymeric carrier sheet.

If necessary, the transparent polymeric carrier sheet surface can be treated to modify its wettability and adhesion to applied coatings (such as a barrier layer coating). Such surface treatments include but are not limited to corona discharge treatment and the application of subbing layers as long as the desired transparency (described above) is achieved.

If desired, the transparent polymeric carrier sheet can also optionally comprise one or more "first" ultraviolet radiation absorbing compounds (e.g., UV dye), but can also be devoid of any ultraviolet radiation absorbing compounds. The one or more compounds of this type can be the same or different as the ultraviolet radiation absorbing compounds in the imaging layer (see below). Each useful ultraviolet radiation absorbing compound generally absorbs electromagnetic radiation of at least 150 nm and up to and including 450 nm. These compounds can be present in the transparent polymeric carrier sheet in an amount of at least 0.01 weight % and up to and including 0.1 weight %, based on the total dry weight of the transparent polymeric carrier sheet. However, the transparent polymeric carrier sheet can be devoid of any IR dye and/or UV dye.

In addition, the transparent polymeric carrier sheet can contain one or more "adhesion promoters" that improve adhesion between it and the adjacent barrier layer. Useful adhesion promoters include but are not limited to, gelatin, poly(vinylidene chloride), poly(acrylonitrile-co-vinylidene chloride-co-acrylic acid), and polyethyleneimine.

Barrier Layer

In some embodiments, the mask precursor also includes the barrier layer disposed on the transparent polymeric carrier sheet and directly between the transparent polymeric carrier sheet and the imaging layer. The barrier layer can be prepared as in prior barrier layers (e.g., see U.S. Pat. No. 9,250,527) or in the embodiments as described in more detail below. The barrier layer can be non-crosslinked nitrocellulose, which may optionally include an IR dye (absorbs IR light) and/or plasticizer. In some aspects, the barrier layer can be devoid of a UV dye (e.g., absorbs UV light). The barrier layer is generally disposed as a relatively uniform coating on the transparent polymeric carrier sheet (that is, being substantially continuous and having fairly uniform wet thickness) and then dried if any solvent is present in the composition formulation.

The barrier layer is generally transparent as that term is defined above. In particular, the barrier layer is transparent to UV radiation used to image the relief-forming precursor, as defined below. As such, the barrier layer can be devoid of a UV dye or material that selectively absorbs UV light.

The barrier layer can include non-crosslinked nitrocellulose, with or without additional non-crosslinked polymers. The nitrocellulose can be non-crosslinked as described herein. The molecular weight of an unit of nitrocellulose group ranges from 459.28 to 594.28 Da, and the molecular formula is expressed as $[C_6H_7O_2(ONO_2)_3]_n$, where n can be 0 to a larger number. The barrier layer can be ablatable with IR irradiation as described herein. The barrier layer can provide a buffer between the imaging layer and the carrier sheet, which is helpful in mask formation.

The barrier layer can include at least one plasticizer. The plasticizer in the barrier layer is present in an amount from about 10% by weight to about 50% by weight, from about 10% by weight to about 40% by weight, or from about 20% to about 30% by weight. The plasticizer can be represented by acetyl tributyl citrate (ATBC), Alchemix, and PEG-1000, or combination thereof. The plasticizer Alchemix can be Alchemix 2340, which can be referred to as NQ Solve 1086, can be a polyester resin in a mixture of ethyl acetate and ethyl alcohol, with the ethyl acetate being 10%-30% by weight and the ethyl alcohol being 5-10% by weight, with the balance polyester resin. The polyester resin can be low molecular weight polyester with hydroxyl functional groups. In an example, the polyester composition can have a number average molecular weight Mn of between about 500 and about 10,000 Da or up to 1000 Da, a polydispersity below about 2, preferably below about 1.8, hydroxyl functionality between 2 and 3, a hydroxyl value of between about 160 and about 260, and an acid number below about 10. The PEG-1000 can be polyethylene glycol with a molecular weight of about 1000 Da.

In some embodiments, the plasticizer can include a plurality of ester groups, such as having a polymer of esters or a plurality of ester moieties, which can include alkyl groups. For example, ATBC includes four alkyl esters coupled together, and Alchemix is a polyester. Also, a polyether can be used, such as PEG, polypropylene glycol, and combinations thereof. Thus, compounds or polymers with a plurality of ether groups or plurality of ester groups, each with an alkyl component associated with each ether or ester. Thereby, alkyl ethers and alkyl esters, such as those with a plurality of alkyl ether moieties or alkyl ester moieties.

The barrier layer may be devoid of an IR dye, but can optionally include the IR dye, such as from 0% up to 10%, or up to 8%, or up to 5%, or up to 3%, or up to 2% or up to 1%. One or more infrared absorbing materials that are collectively identified herein as the "first" infrared radiation absorbing material to distinguish it, if necessary, from the second infrared radiation absorbing material(s) in the imaging layer (described below). The first and second infrared radiation absorbing materials can be one or more dyes or pigments, or mixtures thereof that will provide desired spectral absorption properties and are independently sensitive to electromagnetic radiation in the infrared electromagnetic wavelength range of at least 700 nm and up to and including 1,500 nm and typically of at least 750 nm and up to and including 1,200 nm. For example, the IR dye in the barrier layer can be devoid black dyes or pigments such as carbon black, metal oxides, and other materials described for example in U.S. '987 (noted above). Accordingly, the barrier layer can be specifically devoid of carbon black, such as a carbon black chip (e.g., pre-dispersion). While an IR dye can be included, such an IR dye may be specific for IR light and exclude broadband light absorbers like carbon black in the barrier layer.

Useful first infrared radiation absorbing materials also include IR dyes including but not limited to, cationic infrared-absorbing dyes and photothermal-bleachable dyes. Examples of suitable IR dyes include but are not limited to, azo dyes, squarilium dyes, croconate dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi (chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,569,603 (Furukawa), and U.S. Pat. No. 6,787,281 (Tao et al.), and EP Publication 1,182,033 (Fijimaki et al.).

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.), the disclosures of all of which are incorporated herein by reference. Suitable dyes may be formed using conventional methods and starting materials or obtained from various commercial sources including American Dye Source (Baie D'Urfe, Quebec, Canada) and FEW Chemicals (Germany).

The first infrared radiation absorbing material(s) is generally present in an amount sufficient to provide a transmission optical density of at least 0.025 and typically of at least 0.05 at the exposing electromagnetic radiation wavelength (e.g., IR). Generally, this is achieved by including at least 0.1 weight % and up to and including 5 weight %, or typically at least 0.3 weight % and up to and including 3 weight %, based on the total dry weight of the barrier layer.

The first infrared radiation absorbing material in the barrier layer can be the same or different chemical material(s) as the second infrared radiation absorbing compound that is incorporated into the imaging layer as described below. The infrared radiation absorbing material in the barrier layer may also be different from the infrared radiation absorbing material in the transparent polymeric carrier. In most embodiments, the first and second infrared radiation absorbing materials are the same chemical materials, but exclude black such as carbon blacks. The infrared radiation absorbing materials can be selective for selectively absorbing infrared light, and thereby are not broadband absorbers that absorb UV, visible or other non-IR light. The amounts of the first and second infrared radiation absorbing materials in the imageable material can be the same or different. In most embodiments, they are present in different amounts in the imageable material.

In some embodiments, the barrier layer can include an ablatable un-crosslinked binder material formed from organic polymers, such as non-crosslinked nitrocellulose, can be present in the barrier layer in an amount of at least 30 weight % and up to and including 100 weight %, or more likely in an amount of at least 50 weight % and up to and including 80 weight %, all based on total dry weight of the layer. In some aspects, the plasticizer can be included in the amount recited above with or without the IR dye, and the non-cross-linked nitrocellulose can be the balance of the material.

The barrier layer generally has an average dry thickness of at least 0.5 μm and up to and including 5 μm or typically at least 0.8 μm and up to and including 3 μm.

In some embodiments, the barrier layer can be devoid of a crosslinked nitrocellulose. Also, the barrier layer can be devoid of a crosslinker that can crosslink nitrocellulose. Additionally, the barrier layer can be devoid of a crosslinked polymer.

In some embodiments, the barrier layer can be devoid of particles, such as ablatable particles or non-ablatable particles. The barrier layer can be devoid of metal oxides.

In some embodiments the barrier layer can be devoid of a metalized layer material or a metal therein.

In some embodiments,

Thermally-Ablatable Imaging Layer (IL)

The imaging layer that is incorporated into the mask precursor is generally disposed directly on the barrier layer as a relatively uniform coating (that is, being substantially continuous and having fairly uniform wet thickness) and then dried if any solvent is present in the formulation. In most embodiments, imaging layer is a single coated or applied layer, but in other embodiments, there can be multiple sub-layers or sub-coatings making up the imaging layer disposed directly on the barrier layer described above.

As stated in the terminology, there is essentially no silver halide present in the imaging layer. In other words, no silver halide is purposely added or created in the imaging layer.

In some embodiments, the imaging layer includes non-crosslinked nitrocellulose, carbon black, and an infrared dye, and optionally a plasticizer.

The nitrocellulose can be non-crosslinked as described herein.

The imaging layer can include carbon black of which there are numerous types with various particles sizes that are commercially available. Examples include RAVEN 450, 760 ULTRA, 890, 1020, 1250 and others that are available from Columbian Chemicals Co. (Atlanta, Ga) as well as BLACK PEARLS 170, BLACK PEARLS 480, VULCAN XC72, BLACK PEARLS 1100 and others available from Cabot Corporation. Carbon black may be received as a dispersion or as a chip. Carbon Black Chip, "Predisol C" Black 7, from Sun Chemical is preferred due to its high pigment to binder ratio. Other useful carbon blacks are surface-functionalized with solubilizing groups. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. For example, the carbon black chip can include a carbon black material, such as a pigment, dispersed in a binder and supplied as small pieces or chips (e.g., not provided as solution or in a solvent), where the chip is used to prepare the layer having the carbon black.

The imaging layer can include at least one plasticizer. The plasticizer in the imaging layer is present in an amount from about 10% by weight to about 50% by weight, from about 10% by weight to about 40% by weight, or from about 20% to about 30% by weight. The plasticizer can be represented by acetyl ATBC, Alchemix, and PEG-1000, or combination thereof, which are described above.

In some embodiments, the plasticizer can include a plurality of ester groups, such as having a polymer of esters or a plurality of ester moieties, which can include alkyl groups. For example, ATBC includes four alkyl esters coupled together, and Alchemix is a polyester. Also, a polyether can be used, such as PEG, polypropylene glycol, and combinations thereof. Thus, compounds or polymers with a plurality of ether groups or plurality of ester groups, each with an alkyl component associated with each ether or ester. Thereby, alkyl ethers and alkyl esters, such as those with a plurality of alkyl ether moieties or alkyl ester moieties.

In some embodiments, the plasticizer excludes Alchemix or polyester polymers. Accordingly, in some embodiments, the plasticizer in the imaging layer can include a compound having a plurality of alkyl ester moieties coupled together in a branched formation or being a polymer with a plurality of alkyl ester moieties linked together in a chain.

In some embodiments, the imaging layer includes one or more ultraviolet radiation absorbing materials (UV-light absorbing materials) as a component. These compounds generally have an absorbance of at least 1.5 and up to and including 5 in an electromagnetic radiation wavelength range of at least 300 nm and up to and including 450 nm. In general, useful ultraviolet radiation absorbing materials include but are not limited to benzotriazoles, halogenated benzotriazoles, triazines, benzophenones, benzoates, salicylates, substituted acrylonitriles, cyanoacrylates, benzilidene malonates, oxalanilides, and mixtures thereof. Examples of useful ultraviolet radiation absorbing materials include but are not limited to, UV absorbing dyes or UV stabilizers marketed under the names Uvinul® (BASF), Keyplast® (Keystone Aniline Corporation), Sanduvor® (Sandoz Chemicals Corp.), Hostavin (Clariant), and Tinuvin® (BASF or Ciba). Examples of useful materials are described in U.S. Pat. No. 5,496,685 (Farber et al.). However, embodiments of the imaging layer also omit any UV dye.

The imaging layer also comprises one or more second infrared radiation absorbing materials as a second essential component, which second infrared radiation absorbing materials are defined like the first infrared radiation absorbing materials described above for the barrier layer, and they can be the same or different as the first infrared radiation absorbing materials. The one or more second infrared radiation absorbing materials can be present in the imaging layer in an amount sufficient to provide a transmission optical density of at least 0.5 and typically of at least 0.75 at the exposing wavelength. Generally, this is achieved by including at least 3 weight % and up to and including 20 weight % of the one or more second infrared radiation sensitive compounds, based on the total dry weight of the imaging layer. The IR dye in the imaging layer can be specific for absorbing IR light over visible and UV light, and thereby the IR dye is not a black body material that absorbs a broadband of light.

The imaging layer can optionally include one or more fluorocarbon additives for improved production of halftone dots (that is, pixels) having well-defined, generally continuous, and relatively sharp edges. Examples of useful fluorocarbon additives and amounts are provided in [0087] to [0089] of U.S. '987 (noted above).

Additional optional components of the imaging layer include but are not limited to, other plasticizers, coating aids or surfactants, dispersing aids, fillers, and colorants, all of which are well known in the art as described for example in [0094] to [0096] of U.S. '987 (noted above). For example, the imaging layer further can comprise one or more fluorocarbon additives or one or more non-thermally ablatable colorants. Examples of some of the other suitable plasticizers (e.g., secondary plasticizers) can include aliphatic hydrocarbon oils, e.g., naphthenic and paraffinic oils, liquid polydienes, e.g., liquid polybutadiene, liquid polyisoprene. Generally, secondary plasticizers are liquids having molecular weights of less than about 5,000 Da, but can have molecular weights up to about 30,000 Da. Plasticizers having low molecular weight will encompass molecular weights less than about 30,000 Da. These other secondary plasticizers can also be used in the barrier layer.

All the essential and optional components described above for the imaging layer are dispersed in one or more ablatable polymeric binder materials that include un-cross-linked nitrocellulose, and optionally other synthetic and naturally occurring polymeric materials, that can be ablatable when exposed to light radiation, such as such as IR radiation, visible radiation, or UV radiation. In some aspects, the ablatable polymeric binder in the imaging layer is not crosslinked, and thereby is a non-crosslinked binder. Also, the imaging layer can be devoid of a crosslinker that can crosslink nitrocellulose. Such materials are capable of dissolving or dispersing the essential and optional components in a uniform manner throughout the imaging layer. The one or more ablatable polymeric binder materials can be present in an amount of at least 25 weight % and up to and including 75 weight %, or typically of at least 35 weight % and up to and including 65 weight %, based on the total dry weight of the imaging layer.

In addition to nitrocellulose, useful ablatable polymeric binder materials include but are not limited to, the materials described for example in [0081] to [0085] of US '987. These materials can also be known as "adhesive binders" as described for example in [0081] of U.S. '987. Examples of such materials include but are not limited to, acetyl polymers such as poly(vinyl butyral) s that can be obtained for example as BUTVAR® B-76 from Solution, Inc. (St. Louis, Mo.) and acrylamide polymers that can be obtained as MACROMELT 6900 from Henkel Corp. (Gulph Mills, Pa.). Pressure-sensitive adhesive polymers can also be used for this purpose. These materials may optionally be used with the non-crosslinked nitrocellulose.

In some embodiments, it is advantageous to use binder materials in the imaging layer that are easily thermally-combustible or thermally-ablatable, and that generate gases and volatile fragments at temperature less than 200° C. Examples of these materials are thermally ablatable, polycarbonates, poly(cyanoacrylate)s, polyurethanes, polyesters, polyorthoesters, polyacetals, and copolymers thereof (see for example, U.S. Pat. No. 5,171,650 of Ellis et al., Col. 9, lines 41-50, the disclosure of which is incorporated herein by reference), which can be non-crosslinked.

Other useful ablatable materials for the imaging layer have hydroxyl groups (or hydroxylic polymers) as described in [0082] to [0084] of U.S. '987 (noted above) such as poly(vinyl alcohol)s and cellulosic polymers (such as nitrocellulose that is already included). Still other useful polymers are non-crosslinkable polyesters, polyamides, polycarbamates, polyolefins, polystyrenes, polyethers, polyvinyl ethers, polyvinyl esters, and polyacrylates and polymethacrylates having alkyl groups with 1 and 2 carbon atoms.

Particularly useful abatable materials for the imaging layer in addition to the nitrocellulose include but are not limited to, a polyurethane, poly(vinyl butyral), (meth)acrylamide polymer, polyacetal, poly(cyanoacrylate), a polymer derived at least in part from any of methyl methacrylate, ethyl methacrylate, n-butyl methacrylate, and isobutyl methacrylate, or a combination of two or more of these materials.

The imaging layer can have an average dry thickness of at least 0.5 μm and up to and including 5 μm or typically of at least 0.8 μm and up to and including 2.5 μm.

Protective Topcoat

The mask precursor can optionally include a transparent polymeric overcoat layer that is disposed directly on the imaging layer opposite of the barrier layer. This transparent polymeric overcoat layer can optionally be a particulate-treated protective topcoat. The addition of particulates into such a particulate-treated protective topcoat provides the advantages of improved resolution and increased hilite dot retention for the present invention.

The protective topcoat generally includes one or more transparent film-forming polymers or resins including but not limited to, a methacrylic acid copolymer (such as a copolymer of ethyl methacrylate and methacrylic acid). The body of the protective topcoat can include the small particles as described herein. The particles can be inorganic particles, which can be silica or metal oxide particles, of less than 1 micron in size. The metal oxide particles can be ablative, such as iron oxide particles. Alternatively, the metal oxide particles can be non-ablative, such as titanium dioxide, or zinc oxide. Non-ablative silica particles may also be used. These inorganic particles can be from 0.001 microns to about 0.99 microns, or about 0.01 microns to about 0.75 microns, or about 0.05 microns to about 0.5 microns, or from about 0.1 microns to about 0.25 microns, or any range between any of the recited values.

The inorganic particles may be non-ablative particles as described herein. However, the particulate-treated protective topcoat is ablatable, and thereby the polymeric body is not cross-linked. The body can be prepared to be ablatable, which may be similar to the body composition of the imaging layer.

The protective topcoat can be attached directly to the imaging layer and can have an average dry thickness of at least 0.05 μm and up to and including 1 μm. The thickness may be varied depending on the embodiment.

In some embodiments, it is advantageous to use binder materials in the protective topcoat that are easily thermally-combustible or thermally-ablatable, and that generate gases and volatile fragments at temperature less than 200° C. Examples of these materials are thermally ablatable nitrocellulose, polycarbonates, poly(cyanoacrylate)s, poly(methacrylates), poly(ethyl acrylates), polyurethanes, polyesters, polyorthoesters, polyacetals, and copolymers thereof (see for example, U.S. Pat. No. 5,171,650 of Ellis et al., Col. 9, lines 41-50, the disclosure of which is incorporated herein by reference), which can be non-crosslinked. A 1:1 methacrylic aid-ethyl acrylate copolymer, such as Kolicoat® MAE30 DP is an example.

Other useful ablatable materials for the protective topcoat have hydroxyl groups (or hydroxylic polymers) as described in [0082] to [0084] of U.S. '987 (noted above) such as poly(vinyl alcohol) s and cellulosic polymers (such as nitrocellulose), which can be non-crosslinked. An example grouping of useful polymers are non-crosslinkable polyesters, polyamides, polycarbamates, polyolefins, polystyrenes, polyethers, polyvinyl ethers, polyvinyl esters, and polyacrylates and polymethacrylates having alkyl groups with 1 and 2 carbon atoms, and copolymers thereof. Particularly useful abatable materials for the protective topcoat include but are not limited to, a polyurethane, poly(vinyl butyral), (meth)acrylamide polymer, nitrocellulose, polyacetal, poly(cyanoacrylate), a polymer derived at least in part from any of methyl methacrylate, ethyl methacrylate, n-butyl methacrylate, and isobutyl methacrylate, or a combination of two or more of these materials, such as a copolymer, which can be non-crosslinked.

In addition, the protective topcoat can include fluoroparticles of one or more fluoropolymers dispersed therein as described, for example, in U.S. Pat. No. 6,259,465 (Tutt et al.) the disclosure of which is incorporated herein by reference. An example can include polytetrafluorethylene (PTFE). The fluoro-particles can be present in an amount of about 1% to about 40%. Preferably about 33%.

Additionally, the protective topcoat can include a surfactant, such as a fluoro-surfactant. The fluoro-surfactant can be Capstone FS-3100. The fluoro-surfactant can be present in an amount significantly less than the fluro-particles.

In some embodiments, a silicone-containing surface additive can be included in the protective topcoat. The silicone-containing surface additive can be a polyether modified polydimethylsiloxane, such as BYK 333. The silicone can be present in an amount significantly less than the fluro-surfactant.

Mask

The mask precursor can be considered an imageable material due to having an imageable layer that forms the mask. In some embodiments, the mask precursor can include four layers or films as described herein, in order: (a) a transparent polymeric carrier sheet (film) optionally having a first ultraviolet absorbing compound; (b) a barrier layer also optionally having a first infrared radiation absorbing compound and/or plasticizer; (c) a thermally-ablatable imaging layer (IL) having carbon black, a second infrared radiation absorbing compound and optionally with an ultraviolet absorbing compound, and optionally plasticizer; and (d) a optionally particulate-treated optional protective topcoat.

The mask precursor that is used to form a mask element that is used eventually to form a relief image can be prepared and then processed into the mask as described herein. In some embodiments, the mask precursor 110 is illustrated in FIG. 1A, which has (a) transparent polymeric carrier sheet 115, on which is directly disposed (b) barrier layer 120, optionally containing an ablatable binder material, (c) an ablatable imaging layer 130 that is disposed directly on barrier layer 120 and positioned to receive the light 35 shown by the arrows 35, and (d) the protective topcoat 138 is provided over the ablatable imaging layer 130.

Figure 1B:
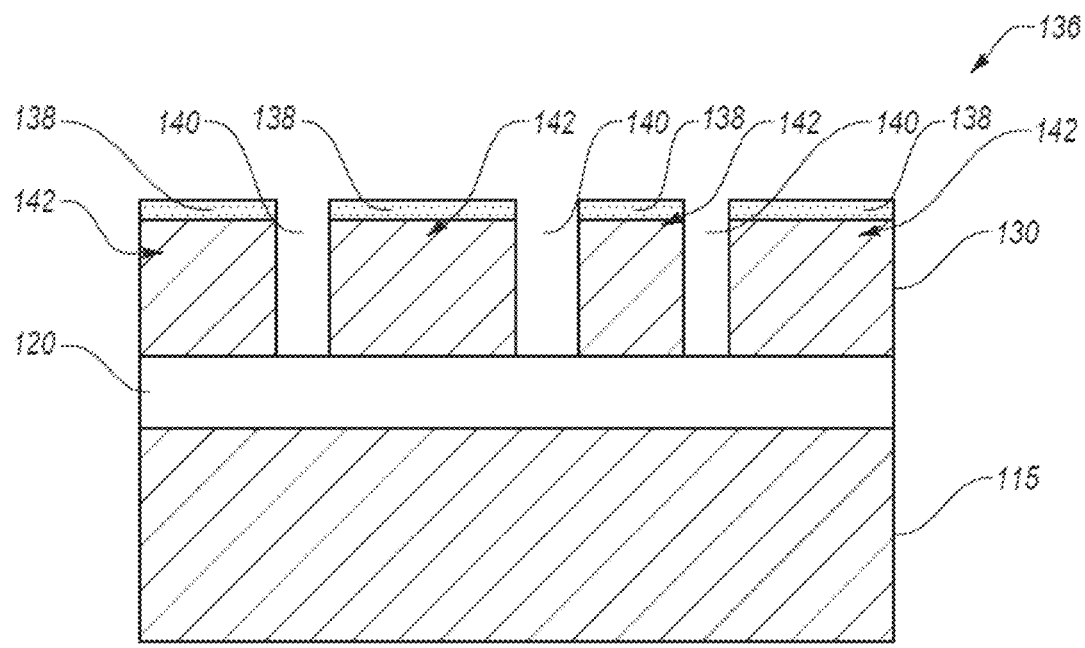
FIG. 1B is a cross-sectional schematic illustration of an embodiment of a mask element formed from the mask precursor illustrated in FIG. 1A.

The exposing step is illustrated for some embodiments in FIG. 1A in which the mask precursor material 110 is exposed to exposing infrared radiation 35 in an imagewise pattern to provide exposed regions 140 and non-exposed regions 142 as illustrated in mask element shown in FIG. 1B and corresponding to a mask image. As shown, the exposed regions 140 are ablated and are removed from the non-exposed regions 142. As such, the exposed regions 140 form the mask image.

Some embodiments according to the present invention can be understood by reference to the general illustrations provided in the sequence of FIG. 1A through FIG. 1E. As described above, FIG. 1A illustrates mask precursor 110 that is exposed to exposing infrared radiation 35 to form mask element (FIG. 1B).

Figure 1C:
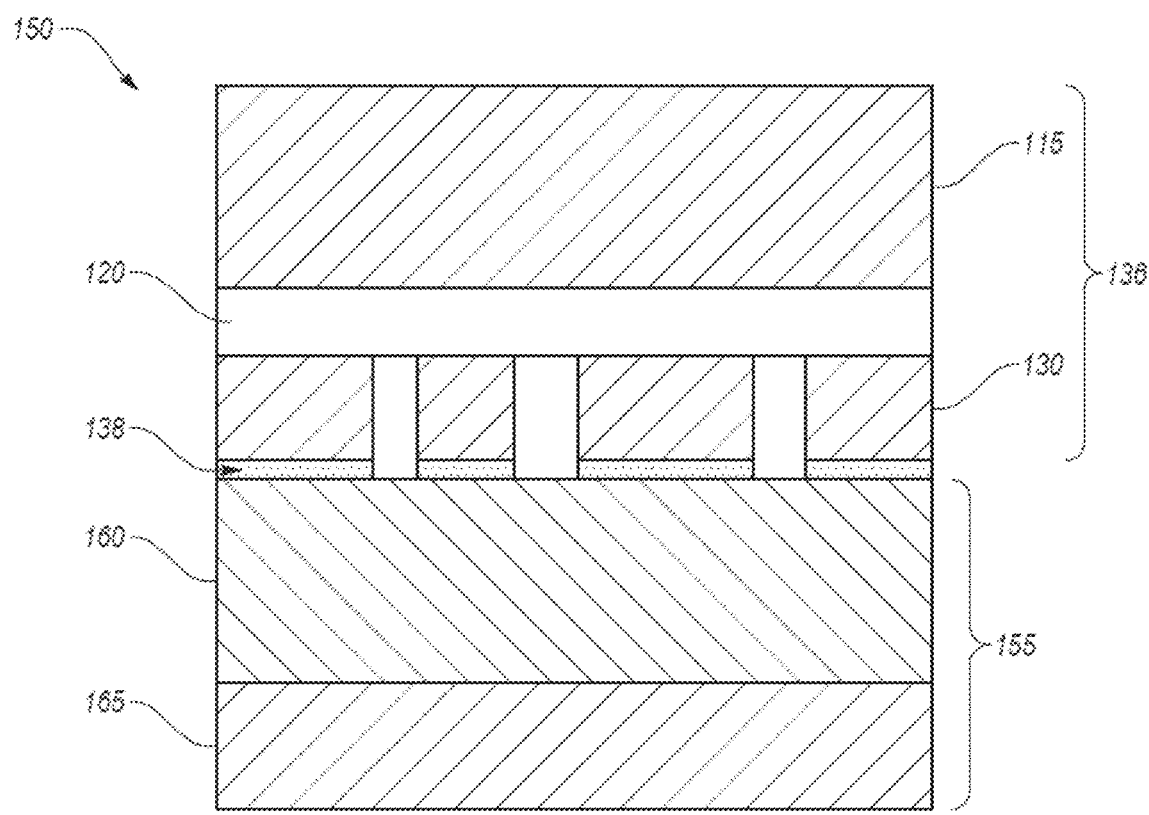
FIG. 1C is a cross-sectional schematic illustration of an embodiment of a relief image-forming assembly according to the present invention, comprising a mask element as illustrated in FIG. 1B that is in complete optical contact with a relief-forming precursor.

In FIG. 1C, the mask element 136 includes the imaging layer 115 over the barrier layer 120 that is over the ablated imaging layer 130 that has the mask image formed therein with the ablated protective topcoat 138. The mask element 136 is shown in intimate or complete optical contact with a relief-forming precursor 155 to provide relief-image forming assembly 150 by contacting the optional protective topcoat 138. Relief-forming precursor 155 includes the UV-sensitive layer 160 that is typically carried on substrate 165.

Figure 1D:
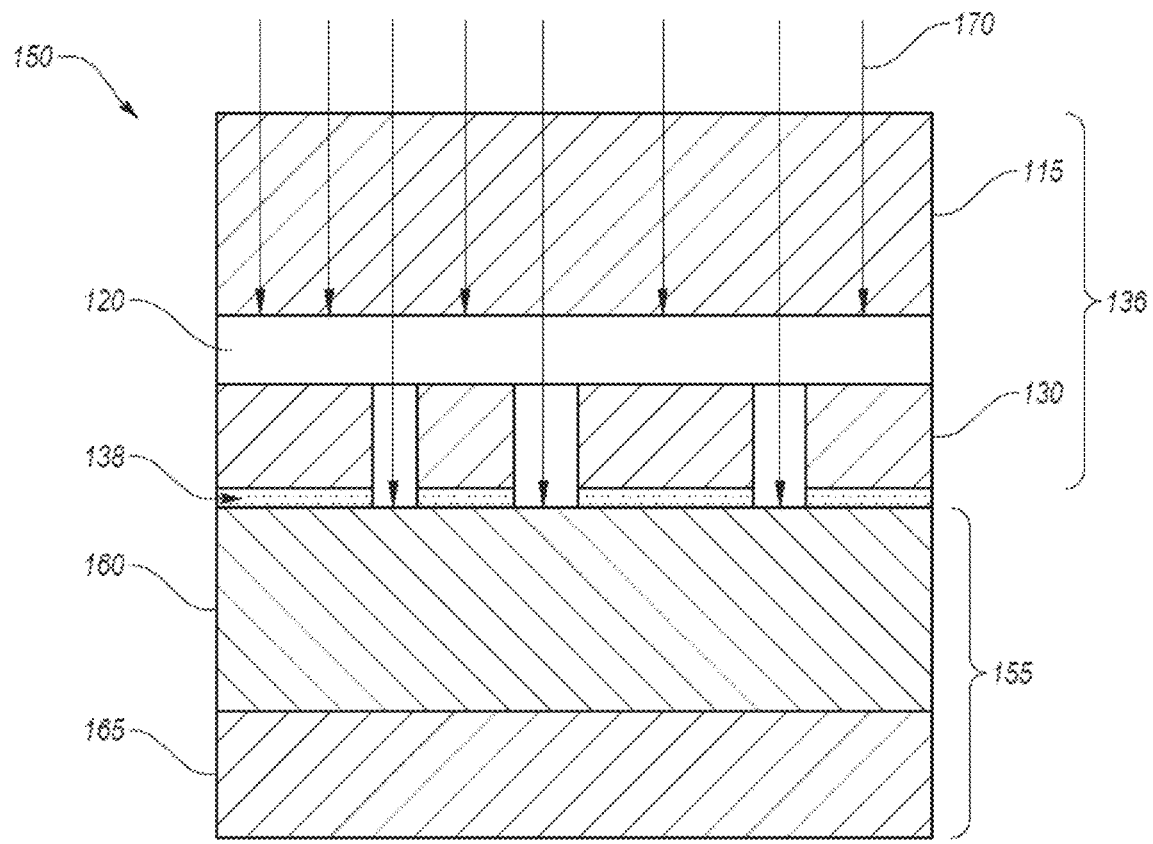
FIG. 1D is a cross-sectional schematic illustration of an embodiment of forming an imaged relief-forming precursor using incident UV radiation through the mask element illustrated in FIG. 1B.

FIG. 1D shows the step of exposing the relief-image forming assembly 150 to UV radiation 170 shown by the arrows. The UV radiation 170 passes through the transparent polymeric carrier sheet 115, the barrier layer 120, and the exposed regions (e.g., element 140—removed imaging layer portions) of imaging layer 130 in the mask element 136 and then the exposed portions in the particulate-treated protective topcoat 138 to cause photocuring in UV-sensitive layer 160 of the relief-forming precursor 155.

Figure 1E:
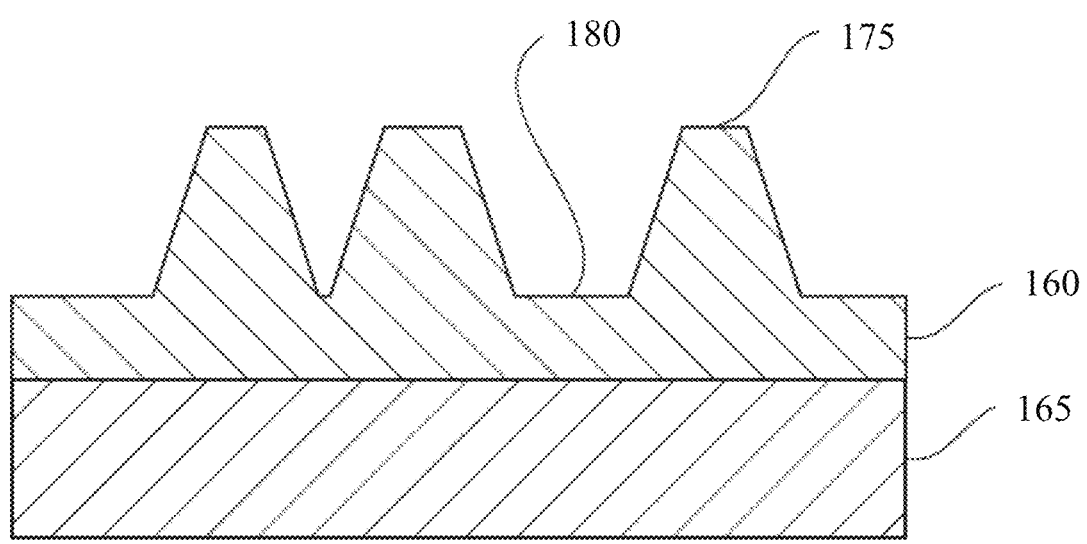
FIG. 1E is a cross-sectional schematic illustration of an embodiment of a relief image element provided after imaging illustrated in FIG. 1D and suitable development process to remove non-exposed regions in the UV-sensitive layer of the imaged relief-forming precursor.

After the UV-exposure, mask element 136 can be removed from the UV-sensitive layer 160 of the relief-forming precursor 155 and a development protocol can provide a relief image as shown in FIG. 1E in the UV-sensitive layer 160. As shown in FIG. 1E, the relief image includes relief image peaks 75 and relief image valleys 80 in the UV-sensitive layer 60.

Forming Mask

In some embodiments, a mask can be formed by producing exposed and non-exposed regions in the imaging layer of the mask precursor embodiments described herein. The choice of imaging mechanism will determine the possible variations in forming the mask image, as described below.

Exposing the mask precursor to ablative light energy to ablate the imaging layer and protective topcoat can be carried out in selected regions, otherwise known as "imagewise exposure." In some embodiments, imagewise exposure can be accomplished using thermal radiation from a thermal or infrared laser that is scanned or rasterized under computer control. Any of the known scanning devices can be used including flat-bed scanners, external drum scanners, and internal drum scanners. In these devices, the mask precursor material is secured to the drum or bed, and the laser beam is focused to a spot that can impinge on the imaging layer of the mask precursor material. Two or more lasers can scan different regions of the imaging layer simultaneously.

For example, the mask precursor material can be exposed to infrared radiation, for example, in the electromagnetic wavelength range of at least 700 and up to and including 1500 nm. Such mask precursor materials contain one or more second infrared radiation absorbing materials in the imaging layer as described above to provide sensitivity to infrared radiation. In these embodiments, the mask precursor material can be suitably mounted to an infrared imager and exposed to the infrared radiation using an infrared laser such as a diode laser or Nd:YAG laser that can be scanned under computer control. Suitable infrared imagers include but are not limited to TRENDSETTER imagesetters and Thermo-Flex Flexographic CTP imagers available from Eastman Kodak Company used for CTP lithographic plate applications and for imaging flexographic elements, DIMENSION imagesetters available from Presstek (Hudson, N.H.) useful for CTP lithographic plate applications, CYREL® Digital Imager (CDI SPARK) available from Esko-Graphics (Kennesaw, Ga.), and OMNISETTER imagers available from Misomex International (Hudson, N.H.) useful for imaging flexographic elements.

This exposing step is illustrated for some embodiments in FIG. 1A in which mask precursor material 10 is exposed to exposing infrared radiation 35 in an imagewise pattern to provide exposed regions 40 and non-exposed regions 42 as illustrated in mask element 36 shown in FIG. 1B and corresponding to a mask image. As shown, the exposed regions 40 are ablated and are removed from the non-exposed regions 42. As such, the exposed regions form the mask image.

The step of forming the mask image can also include a step of removing either exposed or non-exposed regions from the imaging layer if desired. In some embodiments, exposed regions of the imaging layer are removed for example by ablating away the exposed material(s) in the imaging layer. In this mechanism, the exposed regions of the imaging layer are removed from the mask element by the generation of a gas during ablation to leave a mask image. Specific binders (e.g., non-crosslinked) that decompose upon exposure to heat (such as that produced by IR laser irradiation) to rapidly generate a gas can be present in the imaging layer. This action is to be distinguished from other mass transfer techniques in that a chemical rather than a physical change causes an almost complete transfer of the imaging layer rather than a partial transfer.

In other embodiments not illustrated, a mask image can be formed on the carrier sheet by producing exposed and non-exposed regions in the imaging layer and selectively removing the non-exposed regions.

In some embodiments, the mask image in the imaging layer of the mask element can be cured by subjecting it to heat treatment, provided that the properties of the mask element are not adversely affected. Heat treatment can be carried out by a variety of means including but not limited to, storage in an oven, hot air treatment, or contact with a heated platen or passage through a heated roller device. Heat treatment is not necessary for curing to take place.

In still other embodiments, a mask image can be formed in the imaging layer as noted above and the exposed regions can be transferred to a receptor sheet that is then removed from the mask element before it is brought into contact with to a relief-forming precursor. Such procedures are well known in the art.

In a peel-apart imaging mechanism, the exposed regions of the imaging layer can be removed from the carrier sheet using a suitable receptor sheet based on differential adhesion properties in the imaging layer. After imagewise exposure of the mask precursor, the receptor sheet is separated from the carrier sheet and either exposed or non-exposed regions remain in the mask element.

Relief-Forming Precursor

In some embodiments, a photosensitive relief-forming material can be used in a relief-forming photopolymer plate precursor. The photosensitive relief-forming layer can be processed to form a relief image. The photosensitive relief-forming layer can also be used in solvent wash plates or water wash plates.

Considerable details of useful relief-forming precursors, such as flexographic printing plate precursors, letterpress printing plate precursors, and printed circuit boards are provided in U.S. '987 (noted above). Such relief-forming precursors can include a suitable dimensionally stable substrate and a relief-forming layer that is UV (ultraviolet)-sensitive, and optionally a coversheet and/or metal layer between substrate and relief-forming layer. Suitable substrates include dimensionally stable polymeric films and aluminum sheets. Polyester films are particularly useful. Any UV-sensitive material or element in which a relief image can be produced using a mask element is useful in the practice of this invention when it includes a low surface energy additive.

In some embodiments, relief-forming precursors generally include a suitable dimensionally stable substrate, a radiation curable layer in which a flexographic relief image can be formed, and optionally a cover sheet on the radiation curable layer and/or metal layer between the substrate and radiation curable layer. Suitable substrates include flexible, dimensionally stable transparent polymeric films as well metal substrates, such as aluminum sheets. Polyester films are particularly useful as flexible, dimensionally stable, transparent substrates. The relief-forming precursor can optionally include a metal layer disposed between the substrate and the radiation curable layer. This metal layer can include copper or another metal or metal alloy.

Some embodiments also include a removable coversheet that protects the radiation curable layer from fingerprints and other damage and that is disposed on the radiation curable layer. In some embodiments, the flexographic printing plate precursor further comprises metal layer between the substrate and radiation curable layer, or both coversheet and metal layer sandwiching the radiation curable layer.

In some embodiments, the radiation curable layer can be a UV-sensitive layer that is cured by UV light. In some aspects, the UV-sensitive layer can be at least one layer of a relief-forming precursor that is formed by a relief-forming material that is UV-sensitive. Thus, references to the relief-forming material or layer refers to the UV-sensitive material or layer that can be irradiated with UV light and developed into a relief image.

In some embodiments, the relief-forming precursor includes: a backing or base film (e.g., as a substrate), a relief-forming layer (e.g., UV-sensitive material); and optionally a removable coversheet film to protect the photosensitive layer. In another option, a metal layer can be located between the substrate and the relief-forming layer.

In some embodiments, the backing or base can be configured to provide support to the relief-forming layer of the relief-forming precursor. The backing layer can be formed from transparent or opaque material such as paper, cellulose film, plastic, or metal. The backing layer is preferably formed from a transparent material that is flexible. Examples of such materials are cellulose films or plastics such as, PET (polyethylene terephthalate), PEN (polyethylene naphthalate), polyether, polyethylene, polyamide (Kevlar), or nylon. Preferably, the support layer is formed from polyethylene terephthalate (PET). It was also found that the relief-forming layer having the low surface energy additive was able to adhere to the support layer. The support layer can be from about 0.001 to about 0.010 inches thick. Optionally, various layers, such as an antihalation layer and/or an adhesive layer may be positioned between the backing layer and the relief-forming layer. In some aspects, the adhesive layer can include an antihalation material (e.g., light absorbing substance to prevent refraction of light) or may exclude such an antihalation material.

In some embodiments, the relief-forming layer can be a UV light photosensitive material that forms a relief image upon imaging with UV light and developing the image, where the relief image has reduced surface energy. Addition of a low surface energy additive to the UV light photosensitive material can provide a number of desirable properties to a relief image forming protocol, such as easier vacuum drawdown and better lamination to reduce bubble formation. Additionally, the reduced peel force allows for easier removal of the imaged mask from the relief-forming layer after the main UV exposure to form the relief image.

In some embodiments, a reduced surface energy and reduced peel force is obtained by incorporating a low surface energy additive into the composition of the photosensitive material. The low surface energy additive can be included within the matrix of the photosensitive material so as to be present and distributed within the body and on the surface of the photosensitive material. Often, the low surface energy additive is homogeneously mixed within the photosensitive material. However, the additive may be provided randomly or heterogeneously (e.g., non-homogeneously) or in gradients with increasing concentration preferentially to one side or the other.

In some embodiments, the low surface energy additive can include a silicone material, such as a silicone-based monomer having a reactive functional group. The reactive functional group can be selected to be polymerizable with the other polymerizable monomers of the photosensitive material. This allows the silicone to be incorporated into the polymerized material so that it is retained to the portion of the photosensitive material that remains after the relief forming process. As a result, the reactive functional group can be tailored from well-known functional groups that can participate in a polymerization reaction with specific types of other monomers that have the same functional groups or different but suitably reactive functional groups.

In some embodiments, the photosensitive material can be a UV-sensitive layer that includes: an elastomeric binder; at least one polymerizable or photocurable monomer; and a photopolymerizing photoinitiator that is sensitive to UV radiation. Suitable photoinitiator compositions include but are not limited to those described in U.S. Pat. No. 4,323,637 (Chen et al.), U.S. Pat. No. 4,427,749 (Graetzel et al.), and U.S. Pat. No. 4,894,315 (Feinberg et al.).

The elastomeric binder can include more polymers or resins that can be soluble, swellable, or dispersible in aqueous, semi-aqueous, or organic solvent developers (described below) and can include but are not limited to, natural or synthetic polymers of conjugated diolefins, block copolymers, core-shell microgels, and blends of microgels and preformed macromolecular polymers. The elastomeric binder can comprise at least 65 weight % and up to and including 90 weight %, based on total dry UV-sensitive layer weight.

In some embodiments, the elastomeric binder may be a single polymer or mixture of polymers (e.g., homopolymers, copolymers, random copolymers, block copolymers, any with any number of different types of monomers) which may be soluble, swellable or dispersible in aqueous, semi-aqueous or organic solvent developers. Suitable binders include those described in, U.S. Pat. No. 3,458,311 (Alles), U.S. Pat. No. 4,442,302 (Pohl), U.S. Pat. No. 4,361,640 (Pine), U.S. Pat. No. 3,794,494 (Inoue), U.S. Pat. No. 4,177,074 (Proskow), U.S. Pat. No. 4,431,723 (Proskow), and U.S. Pat. No. 4,517,279 (Worns). Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in U.S. Pat. No. 4,323,636 (Chen), U.S. Pat. No. 4,430,417 (Heinz), and U.S. Pat. No. 4,045,231 (Toda) may be used. The elastomeric binder may be present in an amount of at least about 65% by weight of the photosensitive material. The term binder, as used herein, encompasses core-shell microgels and blends of microgels and preformed macromolecular polymers, such as those described in U.S. Pat. No. 4,956,252 (Fryd).

The at least one polymerizable monomer can be configured to be compatible with the elastomeric binder to the extent that a clear, non-cloudy UV-sensitive imageable layer is produced. Polymerizable monomers for this purpose are well known the art and include ethylenically unsaturated polymerizable compounds having relatively low molecular weight (generally less than 30,000 Daltons). Suitable monomers have a relatively low molecular weight, less than about 5000 Da. Unless described otherwise, throughout the specification molecular weight is the weight-average molecular weight. Examples of suitable polymerizable monomers include various mono- and polyacrylates, acrylate derivatives of isocyanates, esters, and epoxides. Additionally, examples of suitable monomers include t-butyl acrylate, lauryl acrylate, the acrylate and methacrylate mono- and polyesters of alcohols and polyols such as alkanols, e.g., 1,4-butanediol diacrylate, 2,2,4-trimethyl-1,3 pentanediol dimethacrylate, and 2,2-dimethylolpropane diacrylate, alkylene glycols, e.g., tripropylene glycol diacrylate, butylene glycol dimethacrylate, hexamethylene glycol diacrylate, and hexamethylene glycol dimethacrylate, trimethylol propane, ethoxylated trimethylol propane, pentaerythritol, e.g., pentaerythritol triacrylate, dipentaerythritol, and the like. Other examples of suitable monomers include acrylate and methacrylate derivatives of isocyanates, esters, epoxides and the like, such as decamethylene glycol diacrylate, 2,2-di(p-hydroxyphenyl) propane diacrylate, 2,2-di(p-hydroxyphenyl) propane dimethacrylate, polyoxyethyl-2,2-di(p-hydroxyphenyl) propane dimethacrylate, and 1-phenyl ethylene-1,2-dimethacrylate. Further examples of monomers can be found in U.S. Pat. No. 4,323,636 (Chen), U.S. Pat. No. 4,753,865 (Fryd), U.S. Pat. No. 4,726,877 (Fryd), and U.S. Pat. No. 4,894,315 (Feinberg). The monomer may comprise at least 5% by weight to about 25% by weight of the photosensitive material, which can be based on total dry weight of the photosensitive material.

The photoinitiator may be any single compound or combination of compounds sensitive to ultraviolet radiation, generating free radicals which initiate the polymerization of the monomer or monomers without excessive termination. The photoinitiator can be sensitive to visible or ultraviolet radiation. The photoinitiator may also be insensitive to infrared and/or visible radiation and can be thermally inactive at and below 185° C. Examples of suitable photoinitiators include the substituted and unsubstituted polynuclear quinones. Examples of suitable systems have been disclosed in U.S. Pat. No. 4,460,675 (Gruetzmacher) and U.S. Pat. No. 4,894,315 (Feinberg). Photoinitiators are generally present in amounts from 0.001% to 10.0% by weight based on the weight of the photosensitive material.

In some embodiments, the photosensitive layer can include: a di- or tri-block co-polymer (e.g., elastomer); at least one photopolymerizable monomer; photopolymerization initiator; plasticizer; additives such as stabilizers, inhibitors, colorants, solvents; and the low surface energy monomer, such as, a silicone acrylate or silicone methacrylate.

In some embodiments, the plasticizer can be any suitable plasticizer known in the art of photosensitive layers for use as described herein. Examples of suitable plasticizers include aliphatic hydrocarbon oils, e.g., naphthenic and paraffinic oils, liquid polydienes, e.g., liquid polybutadiene, liquid polyisoprene. Generally, plasticizers are liquids having molecular weights of less than about 5,000 Da, but can have molecular weights up to about 30,000 Da. Plasticizers having low molecular weight will encompass molecular weights less than about 30,000 Da.

In some embodiments, the additives can include rheology modifiers, thermal polymerization inhibitors, stabilizers, inhibitors, tackifiers, colorants, antioxidants, antiozonants, solvents, or fillers. These materials are commonly used in photosensitive layers and examples can be provided in the incorporated references.

The thickness of the photosensitive layer may vary depending upon the type of printing plate desired. In one embodiment, the photosensitive layer may be, for example, from about 20-250 mils (500-6,400 microns) or greater in thickness, more particularly from about 20-100 mils (500-2,500 microns) in thickness.

In some embodiments, the relief-forming precursor is a flexographic printing plate precursor that includes a suitable UV-curable composition (e.g., photosensitive material) in the UV-sensitive layer (e.g., photosensitive layer) that when exposed through the mask element and developed, provides a relief image in a flexographic printing plate. Such relief-forming precursors generally include a suitable substrate with the photosensitive material. Examples of commercially available flexographic printing plate precursors include but are not limited to, FLEXCEL NX flexographic elements available from Miraclon Corporation, CYREL® Flexographic plates available from DuPont (Wilmington, Del.), NYLOFLEX® FAR 284 plates available from BASF (Germany), FLEXILIGHT CBU plate available from Macdermid (Denver, Co.), and ASAHI AFP XDI available from Asahi Kasei (Japan).

In some embodiments, the relief-forming precursor can also be used to form a printed circuit board wherein a conducting layer (also known as a "printing circuit") is formed on a substrate in the pattern dictated by exposure through a mask element. Suitable precursors to printed circuit boards generally comprise a substrate, a metal layer, and a UV-sensitive imageable layer (e.g., photosensitive material). Suitable substrates include but are not limited to, polyimide films, glass-filled epoxy or phenol-formaldehyde or any other insulating materials known in the art. The metal layer covering the substrate is generally a conductive metal such as copper or an alloy or metals. The UV-sensitive imageable layer can include an UV-curable resin, polymerizable monomers, or oligomers, photoinitiators, and a polymeric binder. Further details of printed circuit boards are provided in U.S. '987 (noted above).

Forming Relief Images

After the mask and relief-forming precursor are both formed as described above, the protective topcoat when included (or imaging layer when protective topcoat excluded) of the mask is brought into complete optical contact with the relief-forming precursor that includes the photosensitive layer that is sensitive to curing UV radiation. This protocol can be accomplished by placing the protective topcoat or imaging layer of the mask onto the relief-forming precursor or vice versa, as described below in more detail. For example, the contact and coupling of the top surface of the mask to the relief-forming precursor can be performed by using lamination equipment and processing. Vacuum drawdown of the top surface of the mask onto the relief-forming precursor can also be carried out, with or without lamination, to achieve desired complete optical contact.

Some embodiments according to the present invention can be understood by reference to the general illustrations provided in the sequence of FIG. 1A through FIG. 1E. When the mask precursor 110 is used, the ablation may also ablate some of the barrier layer 120.

In FIG. 1C, mask element 136 includes the imaging layer 115 over the barrier layer 120 that is over the ablated imaging layer 130 that has the mask image formed therein with the ablated protective topcoat 138. The mask element 136 is shown in intimate or complete optical contact with a relief-forming precursor 155 to provide relief-image forming assembly 150 by contacting the protective topcoat 138). Relief-forming precursor 155 includes the UV-sensitive layer 160 that is typically carried on substrate 165.

FIG. 1D shows the step of exposing the relief-image forming assembly 150 to UV radiation 170 shown by the arrows. The UV radiation 170 passes through the transparent polymeric carrier sheet 115, the barrier layer 120, and the exposed regions (e.g., element 140—removed imaging layer portions) of imaging layer 130 in the mask element 136 and then the exposed portions in the protective topcoat 138) to cause photocuring in UV-sensitive layer 160 of the relief-forming precursor 155.

After the UV-exposure, mask element 136 can be removed from the UV-sensitive layer 160 of the relief-forming precursor 155 and a development protocol can provide a relief image (FIG. 1E) in the UV-sensitive layer 160. As shown, the relief image includes relief image peaks 175 and relief image valleys 180 in the UV-sensitive layer 160.

In some embodiments, a method of forming a relief image is provided. The method can include providing a relief-forming assembly comprising a mask and a relief-forming precursor in complete optical contact with the mask. Then, the method can include exposing a relief-forming layer of the relief-forming precursor to curing ultraviolet radiation through the mask to form an imaged relief-forming layer with ultraviolet-exposed regions forming polymerized regions and non-exposed regions forming non-polymerized regions in the imaged relief-forming layer. Then, the method can include removing the mask from the imaged relief-forming layer. The imaged relief-forming layer can be developed by removing the non-polymerized regions in the imaged relief-forming layer, thereby forming a relief image element having a relief image.

In some aspects, the exposing is with the mask having an optical density greater than 3.0 in the non-imaged area, and less than about 0.20 in the fully ablated imaged area. In some aspects, the exposing is performed for less than about 24 Joules/cm2, less than or about 22 Joules/cm2, less than or about 21 Joules/cm2, less than or about 20 Joules/cm2, less than or about 19 Joules/cm2, less than or about 18 Joules/cm2, or less than or about 17 Joules/cm2.

In some embodiments, the exposing is with the mask being without DigiCap pattern and having an optical density of less than or about 0.18, less than or about 0.16, or less than or about 0.12, or less than or about 0.11.

Lamination

As noted above, the mask element and relief-forming precursor can be placed in complete optical contact so as to provide an air-free interface at the shared interface between the mask top surface and UV-sensitive layer. Generally, this is achieved by laminating the mask to the UV-sensitive layer of the relief-forming precursor by applying suitable pressure or heat, or both pressure and heat to form an air-free or gap-free interface prior to UV exposure. As noted above, vacuum drawdown of the masking element onto the relief-forming precursor can then be useful.

Commercially available laminators that provide both heat and uniform pressure can be used including but not limited to, KODAK model 800XL APPROVAL LAMINATOR available from Eastman Kodak Company (Rochester, NY). CODOR LPP650 LAMINATOR available from CODOR (Amsterdam, Holland), and LEDCO HD laminators available from Filmsource (Casselbury, FL) can also be useful.

In some embodiments, the optional protective topcoat can be removed before lamination or other operations of forming complete optical contact of mask with the relief-forming precursor. The relief-image forming assembly formed by coupling the mask and the relief-forming precursor can be fed into the laminator at a desired speed, temperature, and pressure.

Useful lamination (laminator) devices and methods for using them are described for example in U.S. Pat. No. 7,802,598 (Zwadlo et al.), the disclosure of which is incorporated herein by reference. As noted therein, a pre-press flexographic plate laminator can be used to laminate a mask element ("masking film") on a relief-forming precursor ("pre-press flexographic printing plate") by applying a balanced, non-distorting, optimized laminating force to achieve complete optical contact while minimizing lateral distortion.

In some embodiments, the relief-forming precursor has a separation layer, spacer layer, or anti-tack layer over the UV-sensitive relief-forming layer.

UV Exposure

After complete optical contact has been achieved between the mask and the relief-forming precursor as described above, the relief-forming precursor can be exposed to curing UV radiation through the mask to form an imaged relief-forming precursor with exposed regions and non-exposed regions in the UV-sensitive layer. The exposed regions are cured and solidified by polymerization of the monomers in the UV-sensitive layer. The non-exposed regions remain uncured and the monomers are not polymerized. Thus, the uniformly emitted curing UV radiation is projected onto the relief-forming precursor through the mask image that preferentially blocks some of the ultraviolet radiation by the remaining portions of the imaging layer. In unmasked (exposed) regions, the curing UV radiation will cause hardening or curing of the UV-sensitive composition(s) in the imaging layer. The mask image is therefore substantially opaque to the exposing or curing UV radiation, meaning that the mask image should have a transmission optical density of 2 or more and typically 3 or more in the non-exposed regions. The remaining portion of the imaging layer still include the UV sensitive material to absorb the UV light and block it. The unmasked (exposed) regions of the UV-sensitive composition can be substantially transparent meaning that they should have a transmission optical density of 0.5 or less, 0.2 or less or even 0.1 or less. The masked (unexposed regions) in the mask can have an optical density of at least about 3 and up. Transmission optical density can be measured using a suitable filter on a densitometer, for example, a MACBETH TR 927 densitometer.

Generally, exposure of the relief-forming precursor through the mask element is accomplished by floodwise exposure from suitable irradiation sources of UV radiation. Exposure can be carried out in the presence of atmospheric oxygen. Exposure under vacuum is not necessary as complete optical contact has already been made.

In the manufacture of a relief imaging element, such as a flexographic printing plate, one side of the relief-forming precursor can be generally first exposed to curing UV radiation through its transparent substrate (known as "back exposure") to prepare a thin, uniform cured layer (e.g., relief image valleys 80) on the substrate side of the UV-sensitive layer. The relief-forming precursor is then exposed to curing UV radiation through the mask containing the mask image, thereby causing the UV-sensitive to harden or cure in the unmasked (exposed) regions. Unexposed and uncured regions of the UV-sensitive layer can then be removed by a developing process (described below), leaving the cured or hardened regions (e.g., relief image peaks 75) that define the relief image printing surface of a predetermined desired pattern of shapes and sizes of peaks 75 and valleys 80. The back exposure can be performed either before or after complete optical contact is made between the mask element and the relief-forming layer.

The wavelength or range of wavelengths suitable as the curing UV radiation will be dictated by the electromagnetic sensitivity of the relief-forming layer. In some embodiments, the UV curing radiation can have one or more wavelengths in the range of at least 150 nm and up to and including 450 nm, or more typically of at least 300 nm and up to and including 450 nm. Sources of UV radiation for floodwise or overall exposure include but are not limited to, carbon arcs, mercury-vapor arcs, fluorescent lamps, electron flash units, and photographic flood lamps. UV radiation is particularly useful from mercury-vapor lamps and sun lamps. Representative UV radiation sources include SYLVANIA 350 BLACKLIGHT fluorescent lamp (FR 48T12/350 VL/VHO/180, 115 watts) that has a central emission wavelength of about 354 nm that is available from Topbulb (East Chicago, Ind.), and BURGESS EXPOSURE FRAME, Model 5K-3343V511 with ADDALUX 754-18017 lamp available from Burgess Industries, Inc. (Plymouth, Mass.).

Other suitable sources of UV radiation include platemakers that can be used to both expose the relief-forming precursor to radiation and to develop the imaged relief-forming material after radiation exposure. Examples of suitable platemakers include but are not limited to, KELLEIGH MODEL 310 PLATEMAKER available from Kelleigh Corporation (Trenton, N.J.) and the GPP500F PLATE PROCESSOR available from Global Asia Ltd. (Hong Kong).

The time for exposure through the mask will depend upon the nature and thickness of the UV-sensitive layer of the relief-forming precursor and the source of the and strength of the UV radiation. For example, in one of embodiment, a FLEXCEL-SRH plate precursor available from Eastman Kodak Company can be mounted on a KELLEIGH MODEL 310 PLATEMAKER and back exposed to UV-A radiation through the transparent support for about 20 seconds to prepare a thin, uniform cured layer on the support side of the relief-forming precursor. The relief image forming assembly of the mask and relief-forming precursor can then be exposed to UV radiation through the mask for about 14 minutes. The mask image information is thus transferred to the relief-forming precursor (such as a flexographic plate precursor).

Separating Mask from UV-Sensitive Layer

In general, the methods described herein can also include removing the mask from complete optical contact with the imaged relief-forming precursor after the UV exposure and before developing. Such removal can be by separating the mask top surface from the relief image. This can be done using any suitable manner, such as peeling the two elements apart. For example, this can be accomplished by pulling the mask away from the imaged relief-forming precursor.

In some embodiments, after the UV exposure, the mask can be removed from the relief-forming layer by peeling the top surface of the mask from the relief-forming layer. This can be performed by providing support to one of the mask or relief-forming precursor, and then applying a pulling force to an edge or end of the other of the mask or relief-forming precursor (e.g., the relief-forming layer).

In some embodiments, the mask can be delaminated from the relief-forming precursor, such as by being delaminated the protective topcoat from the relief-forming layer. In these embodiments, the mask is laminated to the relief-forming layer. Then, the mask is delaminated from the relief-forming layer after the UV curing. However, such delamination is not intended to indicate that the mask itself delaminates so that the different layers of the mask are delaminated from each other. Here, the mask is delaminated in whole from the relief-forming layer. Thus, while the mask is delaminated from the relief-forming layer, the mask itself is not delaminated and damaged. Similarly, the relief-forming layer is not delaminated from the relief-forming precursor.

In some embodiments, the relief-forming precursor can include or omit a transparent release layer on the UV-sensitive layer. Thus, the UV-sensitive relief-forming layer can be in direct contact with the top surface of the mask, such that separation separates the mask directly from the relief-forming layer.

In some embodiments, the relief-forming layer can allow for less force to be applied during the peeling apart of the mask and the imaged relief-image precursor (e.g., flexographic printing plate precursor). The mask can be peeled away from the relief-forming precursor more quickly and completely, leaving little is no residual material. This effect provides more rapid development of the imaged relief-image precursor as there is little or no residual material to inhibit the development process. Because peeling is easier, minimal handling and hold down pressure is needed with the flexographic imaging assembly and the process can be readily carried out at room temperature. Thus, heating during the curing process may not be needed.

The flexographic printing plate assembly having the UV-sensitive layer includes a unique combination of materials so that peeling away of the mask can be quick and complete. By "complete", at least 95% and preferably at least 98%, at least 99%, or 100% of the mask is peeled off, leaving very little or no residual material. The composition of the UV-sensitive layer provides a peel force in relation to a mask comprising a mask image of less than about 73 g/inch, preferably less than about 60 g/inch, and more preferably less than about 55 g/in).

In some embodiments, the mask containing the mask image is removed from the UV-exposed UV-sensitive relief-forming layer of the flexographic printing plate precursor by peeling it away at the interface of the mask and relief-forming layer. This peeling process can be carried out as described in U.S. Pat. No. 7,802,598 using vacuum to hold in place. A corner of the mask element is then pulled away from the printing plate at a rate of 2 to 10 cm/sec at peel angle of 150-180° thereby essentially pulling the imaged film back on itself and keeping the imaged film near the vacuum table surface in a continuous motion until the entire mask element is removed from the UV-sensitive layer of the printing plate. In the practice of this invention, at least 95 weight % and preferably 100% of the dry mask element is removed in this operation, so that it can be generally said that the mask element is "completely" or substantially completely removed from the exposed radiation curable layer of the precursor. By "complete", at least 95% and preferably at least 98%, at least 99%, or 100% of the mask is peeled off, leaving very little or no residual material.

Development

After the mask is removed from the relief-forming layer, the imaged relief-forming precursor is then generally developed with a suitable developer (or processing solution, or "washout solution") to form a relief image. Development serves to remove the non-exposed (uncured) regions of the UV-sensitive layer, leaving the exposed (cured) regions that define the relief image as shown in FIG. 1E.

Development can be carried out under known conditions such as for at least 1 minute and up to and including 20 minutes and at a temperature of at least 20° C. and up to and including 32° C. The type of developing apparatus and specific developer that are used will dictate the specific development conditions and can be adapted by a skilled worker in the art.

Post-development processing of the relief image in the imaged relief-forming precursor can be suitable under some circumstances. Typical post-development processing includes drying the relief image to remove any excess solvent and post-curing by exposing the relief image to curing radiation to cause further hardening or crosslinking. The conditions for these processes are well known to those skilled in the art. For example, the relief image can be blotted or wiped dry, or dried in a forced air or infrared oven. Drying times and temperatures would be apparent to a skilled artisan. Post-curing can be carried out using the same type of UV-radiation previously used to expose the relief-forming precursor through the imaged mask material.

Detackification (or "light finishing") can be used if the relief image surface is still tacky. Such treatments, for example, by treatment with bromide or chlorine solutions or exposure to UV or visible radiation, are well known to a skilled artisan.

The resulting relief image can have a depth of at least 2% and up to and including 100% of the original thickness of the UV-sensitive layer (for example, if this layer is disposed on a substrate). For a flexographic printing plate, the maximum dry depth of the relief image can be from at least 150 µm and up to and including 1,000 µm, or typically at least 200 µm and up to and including 500 µm. For a printed circuit board, the UV-sensitive layer can be completely removed in either the exposed or non-exposed regions, to reveal the metal layer underneath. In such elements, the maximum depth of the relief image depends upon the dry thickness of the UV-sensitive layer. Advantageously, in any embodiment, the relief image can have shoulder angles of greater than 50°.

One skilled in the art can readily see the various utilities that such inked elements would have in various industries including the flexographic printing of various packaging materials.

The imaging material of the current invention to produce a mask image can be used to prepare relief printing plates, such as, a Flexographic Printing Plate and a letterpress printing plate. The mask may also be used as a photomask. "A photomask is an opaque plate or film with holes or transparencies that allow light to shine through in a defined pattern. They are commonly used in photolithography and the production of integrated circuits (ICs or "chips") in particular."

EXAMPLES

Commercially available Kodak Flexcel NX TIL-R was imaged by a Kodak Flexcel NX Wide Imager, using a test target at a drum speed of 95 RPM and at laser power setting of 25 W. This produced an Optical Density of 0.80 (15.84% transmission) for Flexcel NX DigiCap pattern. The optical density was measured by a transmission optical densitometer from X-Rite. When "no DC NX" (no DigiCap) pattern was applied to the test target, and the imaging was done by using No-DC imager set up condition for the imager device, the OD or the Dmin was shown to be 0.18 (66.07% transmission).

The imaged TIL-R was then laminated onto a 1.14 mm Flexcel NXH photopolymer plate precursor by using the Kodak Flexcel NX laminator. The laminated mask and photopolymer plate sandwich/assembly was then UV exposed through the mask for a total of 27 Joules/cm2 using an "EVO 5" exposure device to form an imaged relief-forming material. The image-wise exposed photopolymer was then processed by a Flexographic Plate processing equipment, dried and post exposed using normal procedures to create a finished flexographic printing plate ready for flexographic printing. The plate reproduced all highlight dots as low as 0.8% at 150 lpi.

Flexographic printing plates were produced following the general procedure described above for comparative example 1. The following table shows the composition of the improved mask element.

| Example | Bottom Layer | UV Layer | Top layer Abrasion protection layer) |
|---|---|---|---|
| Comparative Example 1 | Barrier Layer (PCA, IR dye, UV dye), CW: 100 mg/ft2 | UV dyes, NC, IR dye | Emax binder (67%), Teflon beads (33%), CW: 20 mg/ft2 |
| Example 1 | NC (100 %), no plasticizer, CW: 165 mg/ft2 | Carbon Black chip (59.40%), NC (31.8%), and IR dye (8.7%), CW: 150 mg/ft2 | Emax binder (67%), Teflon beads (33%), CW: 25 mg/ft2 |
| Example 2 | NC (75%), Alchemix (25%), CW= 180 mg/ft2 | Carbon Black chip (59.4%), NC (31.8%), IR dye (8.7%), CW= 130 mg/ft2 | Emax binder (67%), Teflon beads (33%), CW: 25 mg/ft2 |
| Example 3 | NC (75%), Alchemix (12.5%), ATBC (12.5%), CW: 130 mg/ft2 | Carbon Black chip (49%), NC (22%), IR dye (5%), ATBC (24%), CW: 150 mg/ft2 | Emax binder (67%), Teflon beads (33%), CW: 25 mg/ft2 |
| Example 4 | NC (75%), Alchemix (12.5%), ATBC (12.5%), CW: 80 mg/ft2 | Carbon Black chip (48.95%), NC (21.95%), a IR dye (5%), ATBC (24%), CW: 150 mg/ft2 | Emax binder (67%), Teflon beads (33%), CW: 25 mg/ft2 |
| Example 5 | NC (75%), Alchemix (12.5%), PEG 1000 (12.5%), CW: 130 mg | Carbon Black chip (52%), Nitrocellulose (23.3%), IR dye (7.22%), PEG-1000 (17.4%) | Emax binder (67%), Teflon beads (33%), CW: 25 mg/ft2 |
| Example 6 | NC (75%), ATBC (25%), CW: 80 mg/ft2 | Carbon Black chip (50.3%), NC (22.6%), IR dye (5%), ATBC (22%), CW: 150 mg/ft2 | Emax binder (67%), Teflon beads (33%), CW: 25 mg/ft2 |

The PCA is a mixture of 70% by weight poly(methyl cyanoacrylate) and 30% by weight poly(ethyl cyanoacrylate). The Alchemix, ATBC, and PEG-1000 plasticizers are described herein.

The nitrocellulose (NC) is E150 from Scholle and 5/6 SS from Alchemix. The Carbon Black chip is "Predisol C" Blk 7 from Sun Chemical, comprising of carbon black pigment and nitrocellulose. Before use, the carbon black chip is dispersed in a solvent. Higher carbon black pigment to binder ratio chips or dispersions are preferred for higher OD.

The IR dye is Dye A, having the following structure:

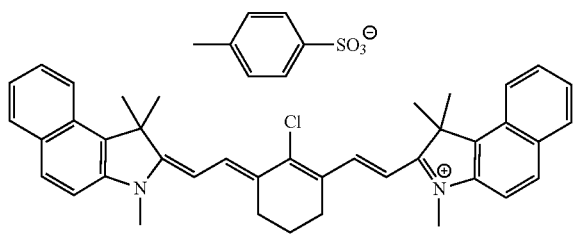

The CW represents the dried coating weight, where solvent is removed during the coating process. For example, 150 mg/ft$^2$ corresponds to about 1.5 microns in thickness. Notably, in the examples there is no cross-linker in the barrier layer or in the imaging layer, which can be applied to all of the embodiments of the mask element described herein.

The Emax binder in the top layer is a 60:40 copolymer from ethyl methacrylate and methacrylic acid.

The following tables provides the imaging condition, UV exposure energy, plate quality and additional physical properties of the imageable films of the Comparative Example 1 and the Examples 1-6.

| Example | Optical Density, unablated area (Non-Imaged Region) | Film Loading | Optical Density for Fully Ablated Area (Imaged Region) | % UV transmission |
|---|---|---|---|---|
| Comparative Example 1 | >3.5 | Automatic Loading | 0.18 | 66.07 |
| Example 1 | >3.5 | Manual Loading Only | 0.12 | 75.86 |
| Example 2 | >3.5 | Automatic Loading possible with difficulty | 0.13 | 74.13 |
| Example 3 | >3.5 | Automatic Loading | 0.11 | 77.62 |
| Example 4 | >3.5 | Automatic Loading | 0.11 | 77.62 |
| Example 5 | >3.5 | Automatic Loading | 0.12 | 75.85 |
| Example 6 | >3.5 | Automatic Loading | 0.11 | 77.62 |

| Example | Edge Curl/ Humidity Resistance, High Humidity | Edge Curl/ Humidity Resistance, Low Humidity | UV Exposure in Joules/cm2 | Plate (0.8% dots at 150 lpi) |
| --- | --- | --- | --- | --- |
| Comparative Example 1 | Excellent | Excellent | 24 J/cm2 | 100% |
| Example 1 | OK | Marginal | 21 Joules/cm2 | 100% |
| Example 2 | OK | OK | 21 Joules/cm2 | 100% |
| Example 3 | Excellent | Excellent | 17 J/cm2 | 100% |
| Example 4 | Excellent | Excellent | 17 j/cm2 | 100% |
| Example 5 | Excellent | Excellent | 19 J/cm2 | 100% |
| Example 6 | Excellent | Excellent | 19 J/cm2 | 100% |

Figure 2:
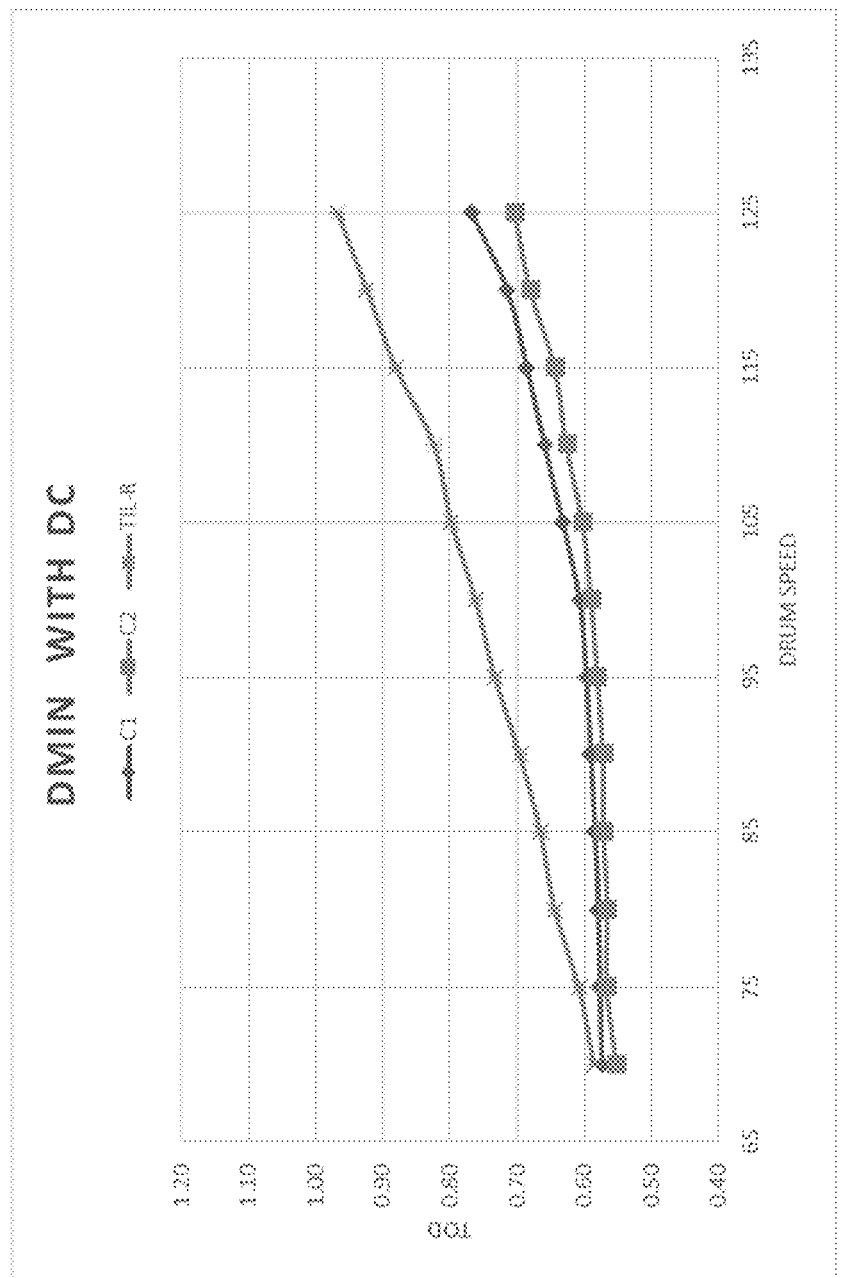
FIG. 2 includes data that shows the transmission optical density (TOD) versus the drum speed for a comparative example and two inventive examples.

Additionally, the Dmin with DC to provide the transmission optical density (TOD) versus drum speed. As shown in FIG. 2, the C2 example has a lower TOD compared to the C1 example, which are both lower than the TIL-R of Comparative Example 1. C2 and C1 refers to Example 2 and Example 1 in the table. (see [0183] for process and comments for DC imaging and OD).

A standard DigiCap NX (DC) pattern was applied to the image file for the conditions shown in FIG. 2. The DC pattern is reproduced in the relief printing plate surface, after imaging, UV exposure and plate processing and drying steps. The DC pattern provides higher and more uniform solid ink density (SID). See U.S. Pat. No. 8,399,177.

SUMMARY

The data shows the improved mask can be used for faster UV processing of relief-forming plate or less energy used. As such, faster processing or less energy is an economic improvement, which provides a benefit with the improved mask. The improved mask provides faster UV exposure time for plate making. This will improve the overall productivity of plate making, as UV exposure time is a rate limiting step for multiple plate making needed by most practitioners.

The present invention reduces manufacturing cost by the use a simple design and by the use of lower cost raw materials and/or reduction of high-cost raw materials. The improved mask also provides improvement in humidity/temperature sensitivity of the mask compared to TIL-R by reducing the edge lift of the coated film. This will help reduce issues with imaging film loading to the imaging device, as high edge lift prevents loading of the imaging film.

Definitions

As used herein to define various components of the barrier layer, non-silver halide thermally-ablatable imaging layer, and other materials, layers, and compositions (for example, a developer or processing solution) used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

The non-silver halide thermally-ablatable imaging layer is also identified herein as the imaging layer.

Unless indicated herein, the term "imageable material" is used to refer to embodiment articles prepared and used according to the present invention. Such imageable materials can also be known as "mask films," "mask precursors," or "masking elements." The imageable material can be transformed into a "mask element" with suitable thermal (IR) imaging, which mask element contains a mask image that can be used to form a relief image according to the present invention.

Unless otherwise indicated, percentages are by weight.

The term "relief-forming precursor" used herein refers to any imageable element or imageable material in which a relief image can be produced by exposure through a mask element. Examples of such relief-forming precursors are described in detail below but some relief-forming precursors include flexographic printing plate precursors, letterpress printing plate precursors, and printed circuit boards. Details of useful relief-forming materials are described in U.S. Patent Application Publication 2005/0227182 (noted above), the disclosure of which is incorporated herein by reference. In this publication, the relief-forming precursors are generally identified as "radiation-sensitive elements."

Unless otherwise indicated, the term "ablative" or "ablation" refers to thermal imaging by means of a laser that causes rapid local changes in imaging layer of an imageable material thereby causing the material(s) in the imaging layer to be ejected from the imaging layer. This is distinguishable from other material transfer or imaging techniques such as melting, evaporation, or sublimation.

The terms "optical contact" and "complete optical contact" have the same meaning and refer to two layers or two elements (as in the case of the mask and a relief-forming precursor) sharing an interface and being in intimate physical contact so that there is essentially no air-gap or void between the contacting surfaces, thus providing an "air-free interface." More precisely, two surfaces are defined as being in optical contact when the reflection and transmission characteristics of their interface are essentially fully described by the Fresnel laws for the reflection and transmission of light at the refractive-index boundary.

Unless otherwise noted, the term "transparent" used herein refers to the ability of a material or layer to transmit at least 95% of impacting (or incident) electromagnetic radiation, such as electromagnetic radiation having a wavelength of at least 200 nm to and including 750 nm (that is, what are generally known in the art as UV and visible radiation).

"Average dry thickness" of a given dry layer is generally an average of 10 different measurements of a dry cross-sectional image of that layer.

One skilled in the art will appreciate that, for the processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety.

The invention claimed is:

1. A mask comprising:
   a mask element, wherein the mask element includes:
      a transparent polymeric carrier sheet that is devoid of an ultraviolet radiation absorbing compound;
      a barrier layer on the transparent polymeric carrier sheet, wherein the barrier layer comprises non-crosslinked nitrocellulose and is devoid of an ultraviolet radiation absorbing compound; and
      an imaging layer on the barrier layer, wherein the imaging layer includes a non-silver halide thermally-abatable material comprising non-crosslinked nitrocellulose, carbon black, and an infrared dye;
   wherein the mask includes:
      imaged regions in the imaging layer, wherein the imaged regions have optical apertures that are substantially devoid of the carbon black and the non-crosslinked nitrocellulose thereof; and
      non-imaged regions in the imaging layer, wherein the non-imaged regions have the non-crosslinked nitrocellulose, carbon black, and infrared dye, wherein the mask has an optical density of greater than or about 3.0 in the non-imaged region, and less than or about 0.20 in the imaged region.

2. A relief-forming assembly comprising:

the mask of claim 1; and a relief-forming precursor in complete optical contact with the mask.

3. A method of making the mask of claim 1, comprising:

providing the mask element without any imaged regions in the imaging layer; and imaging the mask element with infrared light to form the imaged regions in the imaging layer.

4. The method of claim 3, wherein the imaging of the mask element results in the mask having an optical density of less than 0.20 for the imaged region.

5. The method of claim 3, wherein the imaging ablates the carbon black and non-crosslinked nitrocellulose in the imaging layer to form optical apertures for UV light.

6. A method of forming a relief image, comprising:

providing a relief-forming assembly comprising a mask and a relief-forming precursor in complete optical contact with the mask, wherein the mask includes:

a transparent polymeric carrier sheet that is devoid of an ultraviolet radiation absorbing compound;

a barrier layer on the transparent polymeric carrier sheet, wherein the barrier layer comprises non-crosslinked nitrocellulose and is devoid of an ultraviolet radiation absorbing compound; and an imaging layer on the barrier layer, wherein the imaging layer includes a non-silver halide thermally-ablatable material comprising non-crosslinked nitrocellulose having carbon black, and an infrared dye;

imaged regions in the imaging layer, wherein the imaged regions have optical apertures that are substantially devoid of the carbon black and non-crosslinked nitrocellulose thereof; and non-imaged regions in the imaging layer, wherein the non-imaged regions have the non-crosslinked nitrocellulose, carbon black and infrared dye;

exposing a relief-forming layer of the relief-forming precursor to curing ultraviolet radiation through the mask to form an imaged relief-forming layer with ultraviolet-exposed regions forming polymerized regions and non-exposed regions forming non-polymerized regions in the imaged relief-forming layer, wherein the exposing is with the mask having an optical density greater than 3.0 in the non-imaged region, and less than 0.20 in the imaged region;

removing the mask from the imaged relief-forming layer; and developing the imaged relief-forming layer by removing the non-polymerized regions in the imaged relief-forming layer, thereby forming a relief image element having a relief image.

7. The method of claim 6, wherein the exposing is performed to obtain a UV exposure that is from 17 Joules/cm$^2$ to 21 Joules/cm$^2$.

* * * * *